United States Patent
Hatano et al.

(10) Patent No.: US 7,981,701 B2
(45) Date of Patent: Jul. 19, 2011

(54) SEMICONDUCTOR THIN FILM MANUFACTURING METHOD

(75) Inventors: Mutsuko Hatano, Kokubunji (JP); Shinya Yamaguchi, Mitaka (JP); Mikio Hongo, Yokohama (JP); Akio Yazaki, Fuchu (JP); Takeshi Noda, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 468 days.

(21) Appl. No.: 11/030,065

(22) Filed: Jan. 7, 2005

(65) Prior Publication Data
US 2005/0214959 A1 Sep. 29, 2005

(30) Foreign Application Priority Data

Mar. 24, 2004 (JP) .................................. 2004-087493

(51) Int. Cl.
*H01L 21/00* (2006.01)
(52) U.S. Cl. .............. 438/7; 438/16; 438/164; 438/166; 438/487; 257/64
(58) Field of Classification Search ................ 438/7, 16, 438/164, 166, 487; 257/64
See application file for complete search history.

(56) References Cited

U.S. PATENT DOCUMENTS

| | | | | | |
|---|---|---|---|---|---|
| 4,234,358 | A | * | 11/1980 | Celler et al. | 117/41 |
| 5,529,630 | A | * | 6/1996 | Imahashi et al. | 118/665 |
| 6,080,236 | A | * | 6/2000 | McCulloch et al. | 117/4 |
| 6,235,614 | B1 | * | 5/2001 | Yang | 438/486 |
| 2003/0104682 | A1 | * | 6/2003 | Hara et al. | 438/487 |
| 2005/0040146 | A1 | * | 2/2005 | Takami | 219/121.63 |

FOREIGN PATENT DOCUMENTS

| | | | |
|---|---|---|---|
| JP | 10-144621 | * | 5/1998 |
| JP | 11-274078 | | 10/1999 |
| JP | 2003-86505 | | 3/2003 |
| JP | 2003-124136 | | 4/2003 |

OTHER PUBLICATIONS

Yue Kuo, Thin Film Transistors—Materials and Processes, vol. 2: Polycrystalline Silicon Thin Film Transistors, 2004, Kluwer Academic Publishers, pp. 210-211.*
Kwok K. Ng, Complete Guide to Semiconductor Devices, 2002, IEEE Press, p. 2.*
Sposili, R. S. and Im, J. S.; "Line-scan sequential lateral solidification of Si thin films"; 1998; Appl. Phys. A.; 67; pp. 273-276.*

* cited by examiner

*Primary Examiner* — Matthew C Landau
*Assistant Examiner* — Vicki B Booker
(74) *Attorney, Agent, or Firm* — Antonelli, Terry, Stout & Kraus, LLP.

(57) ABSTRACT

A method of forming a semiconductor thin film includes a highly sensitive inspection method for detecting lateral crystals and a crystallizing method. In the crystallizing method, the time-based pulse width of a laser SXL is modulated and an approximate band-like crystal silicon film SPSI is formed in a desired region while scanning the substrate SUB1 bidirectionally in the X and −X directions. In the inspection method, an inspection beam PRO1 is irradiated to the substrate just after the laser SXL is turned off. A protrusion TOKI will be formed on the silicon film portion where the laser SXL is turned off if the state of the silicon film is that of a lateral crystal SPSI. The inspection beam PRO1 is scattered by the protrusion TOKI and observed by a detector. If the state of the silicon film is granular crystal GGSI or aggregated film AGSI, such a protrusion TOKI is not observed.

16 Claims, 21 Drawing Sheets

SEMICONDUCTOR THIN FILM MANUFACTURING METHOD

CLAIM OF PRIORITY

The present application claims priority from Japanese application JP 2004-087493, filed on Mar. 24, 2004, the content of which is hereby incorporated by reference into this application.

FIELD OF THE INVENTION

The present invention relates in general to a method of forming a semiconductor thin film; and, more particularly the invention relates to a method of forming a high quality semiconductor thin film by crystallizing a thin film formed on an insulated substrate by applying a laser beam thereto. The method is preferably applied to the manufacture of active matrix substrates of the type used in image display devices.

BACKGROUND OF THE INVENTION

In recent years, active matrix type display devices (those referred to as active matrix type driving image display devices, or simply as display devices) have come into wide general use. In each of those display devices, an active element, such as a thin film transistor or the like, is used as an element for driving pixels disposed in a matrix arrangement. Many kinds of image display devices are able to display high quality images with the use of many pixel circuits and a driving circuit disposed on an insulated substrate. Each of the pixel circuits is composed of active elements, such as thin film transistors (TFT), each formed with a semiconductor film that is actually a silicon film. It is premised here that the present invention uses a thin film transistor typically as each of such active elements.

In case of thin film transistors that use a non-crystal silicon semiconductor film (hereinafter to be referred to as an amorphous silicon film), as has been used generally as a semiconductor film, it has been difficult to compose a circuit that is fast and exhibits enhanced functions. This is because the performance of the thin film transistor, as represented by its carrier (electron or hole) mobility, is limited. And, one of the effective methods that has been employed in order to realize a thin film transistor with fast mobility, as needed to provide an excellent image quality, is to modify (crystallize) a non-crystal silicon film to provide a polycrystalline silicon film (hereinafter to be also referred to as a polysilicon film) in advance, and then to form thin film transistors with the use of this polysilicon film. For this purpose, a laser beam, such as an excimer laser, is irradiated onto the object amorphous silicon film to anneal and modify the film in quality.

FIGS. 19A and 19B show how to crystallize and modify an amorphous silicon film by irradiating an excimer laser beam thereto. The crystallizing method shown in FIGS. 19A and 19B uses a most typical excimer laser beam to scan and crystallize an amorphous silicon film. FIG. 19A shows an example of the configuration of an insulated substrate having a semiconductor layer to be irradiated with a laser beam. FIG. 19B shows how the semiconductor layer is to be modified in quality using the irradiated laser beam. Although the insulated substrate is usually made of a glass plate, it may also be made of a plastic plate.

In FIG. 19B, a linear excimer laser beam ELA, having a width of several nanometers to several hundreds of 100 nm, is irradiated to an amorphous silicon film AS1 deposited on the insulated substrate SUB with an underlayer (made of Sin, $SiO_2$, or the like, not shown) therebetween, and the irradiation position is shifted at intervals of one to a few pulses in one direction (X direction), as shown by the arrow, to scan the film AS1, thereby annealing and modifying the film AS1 that is formed all over the insulated substrate SUB to produce a polysilicon film PSI. The modified polysilicon film PSI is then subjected to etching, wiring, ion implantation, etc. to form each circuit having to active elements, such as thin film transistors, etc. in its pixel region or driving region.

This insulated substrate is used to manufacture an active matrix type image display device, such as a liquid crystal display device, organic EL display device, or the like. If a conventional excimer laser is used to modify a silicon film, many 0.05 to 0.5 µm crystallized silicon grains (polysilicon) come to grow in a random manner at each laser beam irradiated portion. The electron field-effect mobility of a TFT that is formed with such a polysilicon film is about 200 $cm^2$/V·s or under; the average value is about 120 $cm^2$/V·s.

Another method for realizing such a high quality semiconductor thin film is disclosed in the below-listed patent document 1. According to this method, a continuous oscillation laser (CW laser) beam is scanned and irradiated on the object semiconductor thin film in one direction, whereby a long continuous crystal grows in the scanning direction. There is still another method for realizing such a high quality semiconductor thin film. More specifically, a CW laser is irradiated to island-shaped or linearly-shaped semiconductor thin films while the substrate is being scanned. Otherwise, a thermal gradient is generated on the semiconductor thin film in a laser annealing process to obtain a large flat crystal (the crystal is also referred to as an approximate band-shaped crystal semiconductor thin film; hereinafter to be also referred to as a lateral crystal) in which long crystal grains grow in one direction.

The below-listed patent document 2 discloses still another method that uses a continuous oscillation laser. On the other hand, still another method is disclosed in a document other than the patent documents 1 and 2. According to this method, an ELA is irradiated onto the object film through a slit having a width of several micrometers or a mask to generate a thermal gradient thereon so as to produce a lateral crystal. The use of such a semiconductor thin film makes it possible to realize a high performance of more than 300 $cm^2$/V·s in the electron field-effect mobility.

The below-listed non-patent document 1 discloses a method referred to as SELEX (Selectively Enlarging Laser Crystallization). In this method, a continuous oscillation (CW) laser that has been modulated for optimal pulse width and interval is irradiated to each desired region of a semiconductor thin film selectively to generate non-continuous regions of an approximately band-shaped crystal semiconductor thin film having large, high quality crystal grains that are just like continuous grains. If such a high quality semiconductor thin film such as one obtained with the SELAX method is used for a TFT, the electron field-effect mobility of the thin film is improved to provide high performance characteristics, for example, over 350 $cm^2$/V·s. Hereinafter, a flat crystal in which grains grow to be long in one direction will also be described as a lateral crystal.

In the case of crystallization by the laser annealing method as described above, it is required to improve the uniformity of the crystallization property. If the crystallization property is not uniform, it causes imperfect operations of circuits and a lack of uniformity in the screen display. In order to make the crystallization property uniform, therefore, the crystallization state is evaluated in film forming processes as disclosed in the below-listed patent document 3. According to this method, the crystal grains are the maximum in to diameter and granules are not generated yet. At that time, the gloss value of the thin film surface goes down to the minimum. According to the method disclosed in the patent document 3, therefore, in the polysilicon forming process, the reflection rate of the polysilicon is measured to evaluate the diameter of the crystal grains using a non-destructive examination so as to set the optimum crystallization conditions, as well as to reject defective products earlier and set the optimum conditions for the energy density of the laser beam. More specifically, the amorphous silicon film, before the annealing process, has a high reflection rate, since the film surface is smooth. And, if it is annealed into polysilicon, the crystal grains in the polysilicon grow larger in diameter and the surface becomes rough, so that the film reflection rate goes down due to the scattering of the light, etc. In other words, the reflection rate goes down.

The below-listed patent document 4 discloses still another method. According to this method, as shown in FIG. 20, an inspection beam 902 is irradiated to an amorphous silicon film 901 that is treated with an excimer laser beam 900, and transmitted light 903 and a reflected light 904 are detected by detectors 905 and 906, respectively, whereby the progress of crystallization is monitored. The amorphous silicon film 901 is deposited on a substrate 907. Still another method has been proposed in which the Raman scattering spectroscopic method and the X-ray diffraction method are used to evaluate the crystallization property.

[Patent document 1] Official gazette of JP-A No. 86505/2003
[Patent document 2] Official gazette of JP-A No. 86505/2003
[Patent document 3] Official gazette of JP-A No. 274078/1999
[Patent document 4] Official gazette of JP-A No. 144621/1998
[Non-patent document 1] SID Technical Digest 2002, pp. 158-161

In the method disclosed in the above-listed patent document 3, the thin film reflection rate is varied according to a difference among physical properties of the thin films and the smoothness (unevenness value) of the object film surface. Consequently, any method for measuring the reflection rate in such a way cannot apply to the evaluation of the film surface smoothness, grain diameters, and various unevenness values (defective density, oxygen content, hydrogen content concentration, film thickness, etc.), that is, physical properties of the object thin film, as well as a difference between laser annealing conditions and crystallization results determined by those items. And, the reflection measuring method is just effective for average evaluations; the accuracy is not sufficient. In addition, in such reflection rate measurements, it is not easy to define the measuring angle, etc. accurately. The method is thus inconvenient for operations.

Furthermore, the method disclosed in the above-listed patent document 4 cannot detect slight changes in the state of once-crystallized polysilicon, while it can detect significant state changes from amorphous silicon to polysilicon. And, what should be watched here is that the methods disclosed in the above-listed patent documents 3 and 4 cannot distinguish between lateral crystal and granular crystal, so that these methods are unsuitable for evaluating the crystallization property of lateral crystals.

The evaluation by either the Raman scattering spectroscopic method or the X-ray diffraction method requires a large and complicated measuring apparatus, to the extent that it would be difficult to install the apparatus in a small space. The measurement according to these methods also requires much time, so that evaluations in real time are not available. Those are the problems of the conventional techniques which are required to be solved.

SUMMARY OF THE INVENTION

It is an object of the present invention to provide a method of crystallizing a thin film by optimizing the laser irradiation conditions, while monitoring the crystallization property of each laser-annealed crystallized region in real time and with high sensitivity, as well as to provide an apparatus for manufacturing the same, a semiconductor thin film formed by the apparatus, and a transistor. More particularly, it is an object of the present invention to provide a method of forming a semiconductor thin film while the method includes highly sensitive methods of inspection and crystallization of lateral crystals.

In order to achieve the above-stated objects, the semiconductor thin film forming method of the present invention comprises characteristically the following aspects:

(1) a step of forming an approximate band-shaped crystal semiconductor thin film, which is crystallized and modified in film quality so that crystal grains grow in a scanning direction, by irradiating a continuous oscillation laser beam, or a laser beam obtained by modifying a continuous oscillation laser with time at a time-based pulse width and/or at pulse intervals, to a given region of a semiconductor thin film that has been formed on an insulated substrate while scanning the laser beam on the substrate; and a step of evaluating the film quality of the semiconductor thin film by irradiating an inspection beam to a predetermined region of the approximate band-shaped crystal semiconductor thin film in a fixed time after the start of the laser beam irradiation, and then detecting the scattered light, reflection light, the intensity of the diffraction light, or their distribution.

(2) In the aspect (1), a modified region is formed with the approximate band-shaped crystal semiconductor thin film, and then a plurality of modified regions formed in this way are arranged so as to be separated from each another spatially.

(3) In the aspect (1), if there is any region that does not satisfy a predetermined film quality in the step of evaluating the film quality of the semiconductor thin film, the step of forming the approximate band-shaped crystal semiconductor thin film includes a step of crystallizing the region by irradiating the laser beam to the region again.

(4) According to another aspect of the present invention, the semiconductor thin film forming method comprises;

a step of forming at least one modified region with an approximate band-shaped crystal semiconductor thin film, which is crystallized and modified in film quality so that crystal grains grow in the scanning direction, by irradiating a continuous oscillation laser beam, or a laser beam obtained by modifying a continuous oscillation laser with time at a time-based pulse width and/or at a pulse interval, in a given region of said semiconductor thin film formed on an insulated substrate, while scanning the laser beam on the substrate; and a step of evaluating the film quality of the semiconductor thin film in the modified region by irradiating an inspection beam to an end region of the modified region in the scanning direction, and then detecting the intensity of the scattering light.

(5) In aspect (4), a plurality of the modified regions are formed so as to be separated from each another spatially.

(6) In aspect (4), if there is any region that does not satisfy a predetermined film quality in the step of evaluating the film quality of the semiconductor thin film, the step of forming the modified region includes a step of crystallizing the semiconductor thin film of the modified region again.

(7) According to still another aspect of the present invention, the method comprises:

a step of forming an island-shaped or linearly-shaped semiconductor region consisting of an approximate band-shaped crystal semiconductor thin film, which is crystallized and modified in film quality so that crystal grains grow in the scanning direction, by irradiating a continuous oscillation laser beam, or laser beam obtained by modifying a continuous oscillation laser with time at a time-based pulse width and/or at pulse intervals, to the island-shaped or linearly-shaped semiconductor thin film, while scanning the laser beam on the film; and a step of evaluating the film quality of the semiconductor thin film by irradiating an inspection beam to an end region of the island-shaped or linearly-shaped semiconductor region, an then detecting the intensity of the scattered light.

(8) In aspect (7), a plurality of the island-shaped or linearly-shaped semiconductor regions each made of the approximate band-shaped crystal semiconductor thin film are formed so as to be separated from each another spatially.

(9) In aspect (7), if there is any region that does not satisfy a predetermined film quality in the step of evaluating the film quality of said semiconductor thin film, the step of forming the plurality of island-shaped or linearly-shaped semiconductor regions made of the approximate band-shaped crystal semiconductor thin film includes a step of irradiating the laser beam to the island-shaped or linearly-shaped semiconductor thin film to crystallize the region.

(10) In aspect (7), the step of evaluating the film quality of the semiconductor thin film includes detecting the intensity of the scattered light with a detector disposed outside the path of direct reflection light that is returned from the crystallized region.

(11) In aspect (7), the inspection beam is 200 nm to 700 nm in wavelength and the inspection beam is injected into the substrate from the surface.

(12) In aspect (1), the insulated substrate is an active matrix substrate used for an image display device, said substrate having a pixel region that occupies most of its center portion and a driving circuit region disposed outside the pixel region; and the continuous oscillation laser beam, or laser beam obtained by modulating the time-based pulse width and/or pulse interval of the continuous oscillation laser, is scanned bidirectionally in parallel to the periphery of the insulated substrate, and the plurality of the approximate band-shaped crystal semiconductor thin films are disposed along the driving circuit region of the substrate.

(13) In aspect (4), the insulated substrate is an active matrix substrate used for an image display device. The substrate has a pixel region that occupies most of the center portion of the substrate and a driving circuit region disposed so as to extend outside the pixel region. The continuous oscillation laser beam or laser beam obtained by modulating the time-based pulse width and/or pulse interval of the continuous oscillation laser is scanned bidirectionally in parallel to the periphery of the insulated substrate. And, a plurality of the modified regions made of the approximate band-shaped crystal semiconductor thin film are disposed at predetermined intervals along the driving circuit region of the substrate.

(14) In aspect (7), the insulated substrate is an active matrix substrate used for an image display device. The substrate has a pixel region that occupies most of the center portion of the substrate and a driving circuit region disposed so as to extend outside the pixel region. The continuous oscillation laser beam or laser beam obtained by modulating the time-based pulse width and/or pulse interval of the continuous oscillation laser is scanned bidirectionally in parallel to the periphery of the insulated substrate. And, a plurality of the island-shaped or linearly-shaped modified regions made of the approximate band-shaped crystal semiconductor thin film are disposed at predetermined intervals along the driving circuit region of the substrate.

(15) In aspects (1) to (14), the present invention can configure an image display device with use of an insulated substrate having thin film transistors, each of which uses the approximate band-shaped crystal semiconductor thin film for a channel.

(16) Furthermore, the present invention disposes many pixels in a matrix array on the insulated substrate to form an active matrix type pixel region at the major portion of the insulated substrate, which includes a driving circuit region having a scanning line driving circuit for driving the pixels and a signal line driving circuit. At least the signal line driving circuit is configured with thin film transistors. Each of those thin film transistors uses an approximate band-shaped crystal semiconductor thin film for a channel.

(17) Furthermore, the present invention provides each circuit, other than the scanning line driving circuit for driving the pixels and the signal line driving circuit, with a circuit on the insulated substrate. The provided circuit uses thin film transistors, each of which uses an approximate band-shaped crystal semiconductor thin film for a channel.

(18) Furthermore, the present invention can configure a liquid crystal display device by sealing liquid crystal in a gap between a substrate disposed to face the insulated substrate and the insulated substrate.

(19) Furthermore, the present invention can form an organic EL layer on the insulated substrate to configure an organic EL display device.

(20) Furthermore, the present invention can configure various kinds of image display devices having an active matrix substrate on a low-price insulated substrate made of glass, plastic, or the like. The active matrix has high performance semiconductor thin film transistors, each of which assures high performance and highly reliable operations, as well as by excellent in uniformity among devices.

While preferred forms of the present invention have been described, it is to be understood that modifications will be apparent to those skilled in the art without departing from the spirit of the invention.

As described above, according to the present invention, it is possible to provide a high quality and homogeneous semiconductor thin film, in which both surface roughness and crystal defects are reduced, by inspecting the state of the semiconductor thin film which has been crystallized in a laser annealing process with a fast and highly sensitive method. And, employing this semiconductor thin film for a driving circuit to be provided on an active matrix substrate of an image display device enables the image display device to be configured with semiconductor thin film transistors that are excellent in uniformity of operation characteristics among devices, as well as with the active matrix substrate.

DETAILED DESCRIPTION OF THE PREFERRED EMBODIMENTS

Hereunder, various preferred embodiments of the present invention will be described with reference to the accompanying drawings. It is premised here that the semiconductor thin film is made mainly of silicon (Si), although the thin film material also may be any of Ge, SiGe, compound semiconductors, chalcogenide, etc. to obtain the same effect. The preferred embodiments of the present invention will be described on the assumption that silicon, which is a general material, is to be used. And, in addition to the modification of any polysilicon semiconductor films formed on insulated is substrates made of glass or the like for image display devices, the present invention also can be applied to the modification of any semiconductor films formed on, for example, plastic substrates and silicon wafers.

In the following examples, a second harmonic solid state laser (wavelength $\lambda=532$ nm) of the continuous oscillation (CW) type with a LD (laser diode) exciting $Nd:YVO_4$ laser is used to produce a target laser beam. The laser beam should preferably have a wavelength of 200 to 700 nm so that the laser beam is absorbed into amorphous silicon or polysilicon semiconductor thin films. More specifically, any one of the second, third, fourth harmonic laser beams of the Nd: YAG laser, the Nd; $YVO_4$ laser, the Nd: YLF laser may be used. When both large output and stability are taken into consideration, however, the most preferable laser is the second harmonic laser (wavelength $\lambda$ 532 nm) or second harmonic laser of the $Nd:YVO_4$ laser. The same effect is also obtained by using any one of the excimer laser, the Ar laser, the semiconductor laser, and the solid state laser.

Figure 1A:
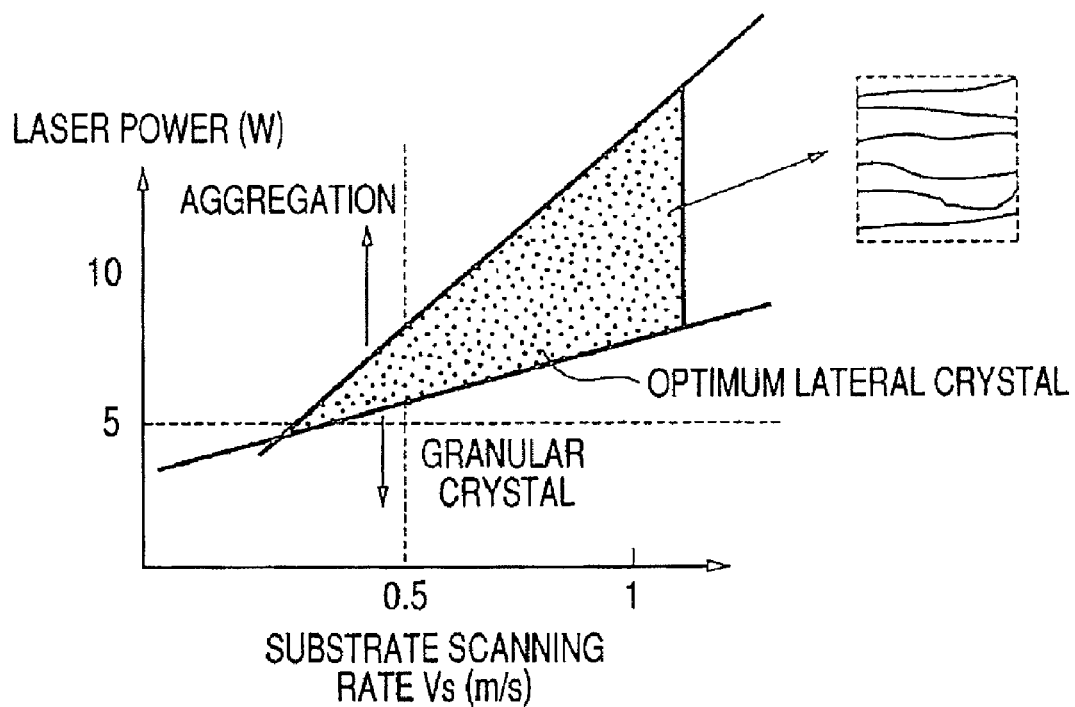
FIG. 1A is a graph showing process conditions for obtaining a lateral crystal on the basis of a relationship between laser power and laser or scanning speed of an insulated substrate.

At first, a description will be given to indicate how the following embodiments of the present invention have been designed. FIG. 1A is a graph for denoting process conditions on which lateral crystals are to be obtained showing the relationship between a laser power and a scanning speed of a laser on an insulated substrate. In FIG. 1A, the horizontal axis denotes the scanning speed Vs (m/s, a substrate scanning speed) and the vertical axis denotes the laser power (W). An optimum lateral crystal, which is denoted with an arrow in FIG. 1A, is obtained under the optimum process conditions that exist inside the triangle shown in FIG. 1A. If the optimum conditions are not satisfied, as denoted with a thick arrow, the crystallization state becomes granular (down arrow) or an aggregation (up arrow)

Figure 1B:
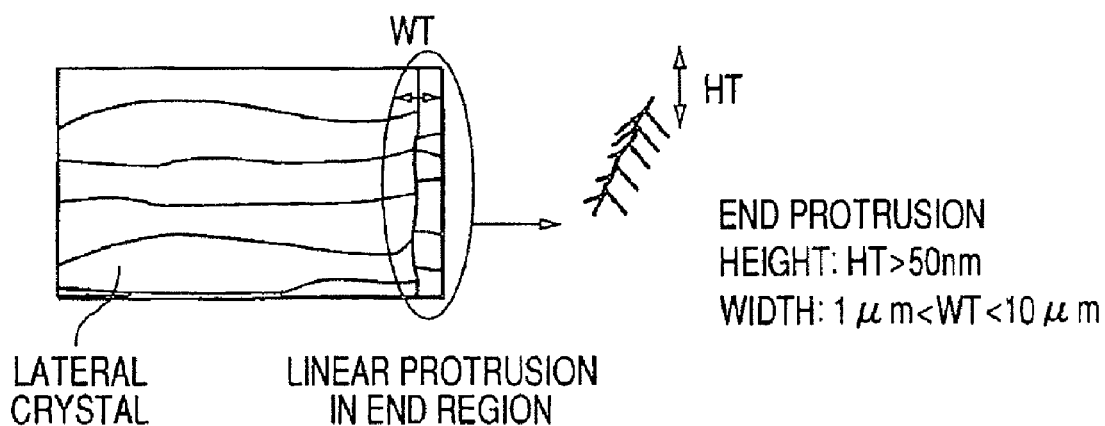
FIG. 1B is a diagram which illustrates a lateral crystal and an end protrusion formed in the scanning end region of the lateral crystal.
Figure 1C:
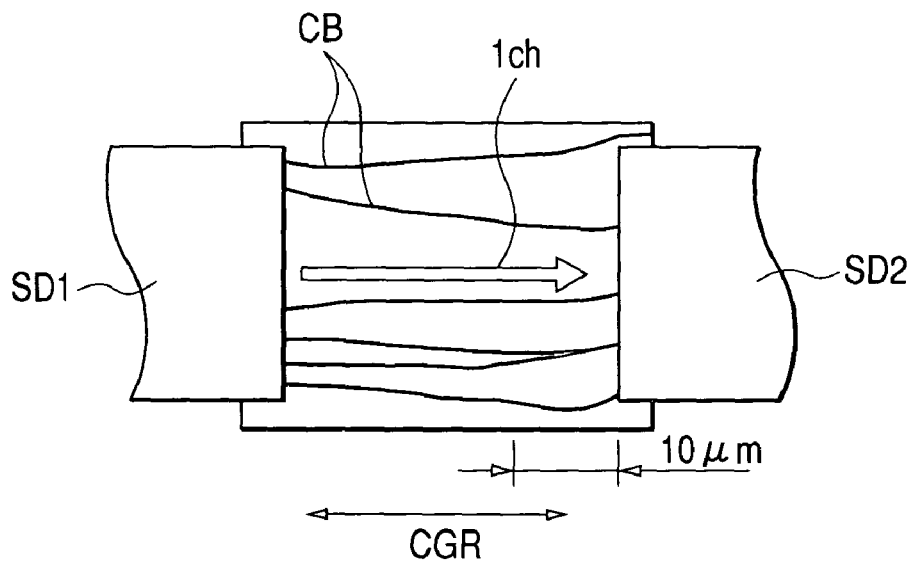
FIG. 1C is a diagram which illustrates a channel orientation when a thin film transistor is formed in a lateral crystal semiconductor thin film.
Figure 1D:
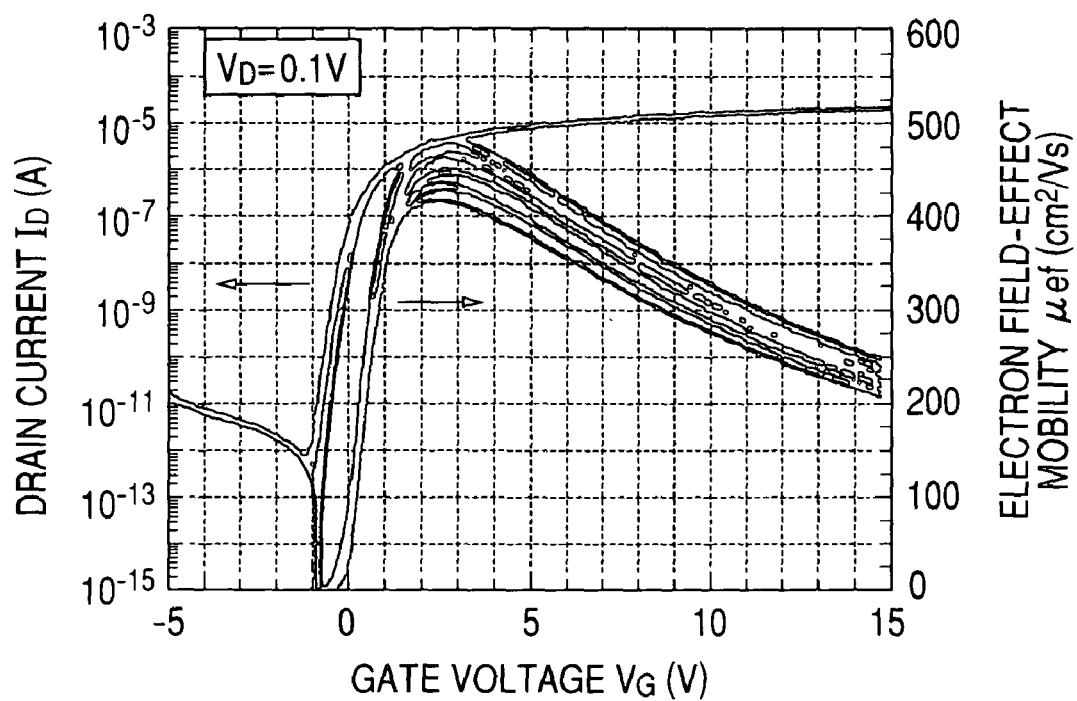
FIG. 1D is a graph showing characteristics of a thin film transistor to formed in the lateral crystal semiconductor thin film.
Figure 1E:
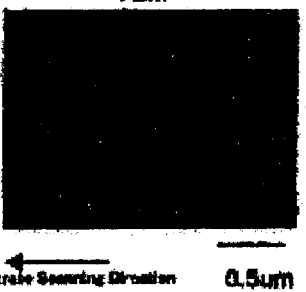
FIG. 1E is a table summarizing the properties classified as crystallization properties and their features.

FIG. 1B illustrates a lateral crystal and an end protrusion (hereinafter to be also referred to simply as a protrusion) that is formed in its end region. FIG. 1C illustrates a channel direction when a thin film transistor is formed in a lateral crystal semiconductor thin film. FIG. 1D is a graph showing the characteristics of the thin film transistor formed in the lateral crystal semiconductor thin film.

Table 1 summarizes the properties classified as crystallization properties and their features. In the table, the lateral crystal is approximately band-like (or flowing crystal, that is, a lateral crystal) crystal growing in the laser irradiation direction. This crystal has anisotropy such that the crystal is large in the laser irradiation direction or growing direction corresponding to the substrate scanning direction and small in the vertical direction transverse to the growing direction. The crystal surface is smooth. Such a lateral crystal is characterized by the shape of its end region modified to a lateral crystal.

An end of a modified region corresponds to a region formed when the laser beam irradiation is switched from on to off or to a region formed in the end region of a semiconductor obtained by irradiating a laser beam to an island-shaped or linearly-shaped semiconductor thin film. In this region, as shown in FIG. 1B, an almost linearly-linked protrusion having a height HT of over 50 nm (hereinafter, to be referred to as an end protrusion) is generated. The protrusion is 1 μm to 10 μm in width WT. The height HT and width WT of the protrusion changes according to the laser beam scanning speed, the power density, the energy density, and the beam shape.

In a region where the laser beam is turned off or in an end region formed like an island, crystal growing is also recognized in a direction opposite to that of the crystal growing. In such a case, therefore, a collision occurs between crystal growths from both sides. This is why a protrusion is formed in the end region. This protrusion proves that crystals have grown laterally. On the other hand, if the applied energy is insufficient for crystal growing, the crystal state becomes granular, as denoted in the middle row in Table 1. These granular crystals are under 1 μm in length just like the crystals obtained in a conventional excimer laser annealing process (ELA), and they grow from cores formed at random. Thus, the crystal directional property is low and the whole film surface comes to have an unevenness of over 10 nm. Particularly, a protrusion grows at a height over 10 nm in each grain boundary region. In the end region, no crystal grows in a direction opposite to that of the crystal growing, so that no protrusion is formed there.

On the other hand, as shown in the bottom row in Table 1, there is a state in which crystal aggregation occurs. This crystal aggregation occurs when fused silicon goes into the liquid state in a laser annealing process as semi-cylindrical stripe crystals and part of the silicon film comes to peel off. And, the film surface comes to have an unevenness of over 10 nm. The crystal grains have anisotropy in that they are large in diameter in the crystal growing direction corresponding to the laser irradiation or substrate scanning direction and small in the vertical direction transverse to the crystal growing direction. In each end region, a dot-like protrusion is formed corresponding to whether or not a film exists, and no linearly-linked protrusion is formed there.

In this embodiment, the characteristic structure of the crystal in the end region is detected to determine whether or not a lateral crystal is formed. As described with reference to FIG. 1A, in which the horizontal axis denotes a scanning speed and the vertical axis denotes a laser power, it has been found that a lateral crystal is formed in the gray triangular region shown in the graph. In the triangular region, crystal aggregation occurs if the laser power is high and the scanning speed is slow. On the other hand, if the energy is insufficient, granular crystals are formed there.

Next, a description will be made for a channel direction that is assumed when a thin film transistor is formed in a lateral crystal semiconductor thin film. In FIG. 1C, a grain boundary CB, between single crystals of approximate band-like crystal silicon films that are formed as silicon islands, is formed almost in the same direction as the crystallizing direction CGR. Then, a source electrode SD1 and a drain electrode SD2 are formed respectively at positions on opposite ends along that crystallizing direction CGR. The direction of the current (channel current) Ich flowing between the source electrode SD1 and the drain electrode SD2 is set to be approximately parallel to the crystallizing direction CGR. And, because the crystallizing direction CGR and the current Ich direction are the same, the electron mobility in the channel is improved.

As shown in the characteristic of the thin film transistor formed under the condition for obtaining the optimum lateral crystal shown in FIG. 1D, each transistor is high in performance, so that the electron field-effect mobility μef is over 350 cm²/Vs and there is excellent uniformity among transistors. The transistor characteristics are denoted in a graph obtained by measuring a plurality of the transistors at a drain voltage VD=0.1(V) and a gate width of 4 μm, and a gate length of 4 μm. In the graph, the horizontal axis denotes the gate voltage VG(V) and the vertical axis denotes the drain current ID(A) and electron field-effect mobility μef (cm²/Vs).

First Embodiment

Figure 2:
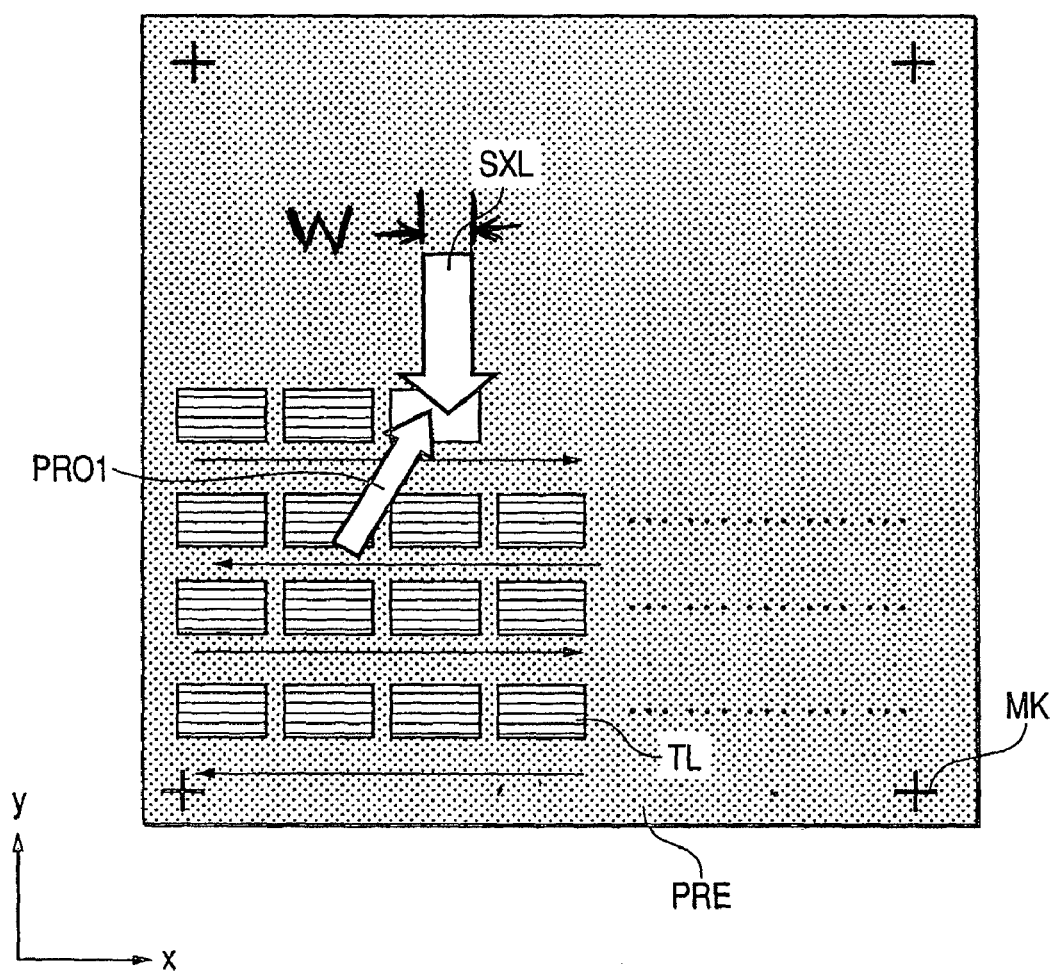
FIG. 2 is a diagram which illustrates how to form a semiconductor thin film on which lateral crystals are formed and disposed like tiles at predetermined intervals in a given region according to a first embodiment of the present invention.

FIG. 2 illustrates how to form a semiconductor thin film in this first embodiment. On the semiconductor thin film, lateral crystals are disposed like tiles at predetermined intervals in a given region. Then, a plurality of modified regions TL are formed with a silicon film having lateral crystals (approximate band-like grown crystals) by irradiating a laser beam SXL to a precursor PRE made of amorphous or polysilicon formed on a buffer layer BFL of the insulated substrate SUB1. In this first embodiment, a plurality of the modified is regions TL are disposed like tiles so as to be separated from each another spatially. This is why these modified regions TL are often described as tiles TL.

The laser beam is modulated with time at a predetermined width and/or at pulse intervals using a modulator, for example, an EO (Eleotro-Optic Device) that makes good use of the electro-optic effect or AO (Acoustic-Optic Device) that makes good use of the acoustic optic effect, or the like. And, the laser beam is scanned to produce modified regions of a given size at given intervals or in a matrix array consisting of a plurality of rows and a plurality of columns. The present invention can thus be achieved easily by modulating a continuous oscillation laser with time at a pulse width of 100 ns to 100 ms and at pulse intervals of 10 μs or under.

As shown in FIG. 2, both the pulse width and pulse interval are controlled and the laser beam SXL having a width W of 5

μm is irradiated to the object substrate while the substrate is scanned at a speed of 0.5 m/s in the x direction, then shifted in the y direction to be scanned in the −x direction, thereby obtaining modified region tiles TL having lateral crystals in the x and −x scanning directions. The insulated substrate SUB1 has positioning marks MK, which are used as positioning targets for scanning the laser beam SXL.

Because the laser beam SXL is irradiated intermittently in such a way to scan the substrate, a plurality of modified regions TL can be produced. If only one modified region TL is to be formed, the modification of the laser beam with time is not required necessarily.

In this first embodiment, when crystallization begins, an inspection is beam PRO1 is irradiated to a predetermined region in a modified region TL at fixed intervals after the start of laser beam irradiation, and then it's the scattered light, reflection light, the intensity of the diffraction light, or the distribution of those lights are detected to evaluate the quality of the semiconductor thin film in real time. Where to irradiate the inspection beam PRO1 can be set freely in the modified region TL. The inspection beam PRO1 should preferably be irradiated at the end region of the modified region TL to assure the desired accuracy, however. As described with reference to FIG. 1, this is because each lateral crystal has a protrusion in its end region, and the inspection beam PRO1 is scattered by the protrusion. This is why the crystallization property is evaluated according to how the inspection beam PRO1 is scattering.

As shown in FIG. 2, if a modified region to be evaluated, that is, a tile TL, is located just before the region being currently laser-irradiated, the whole apparatus comes to be controlled more easily. The region being current laser-irradiated and the modified region TL to be evaluated may be the same. In that case, the evaluation should be made for a certain time, preferably 10 μs or under, after the irradiation until the semiconductor thin film fused by laser irradiation is solidified.

Second Embodiment

Figure 3:
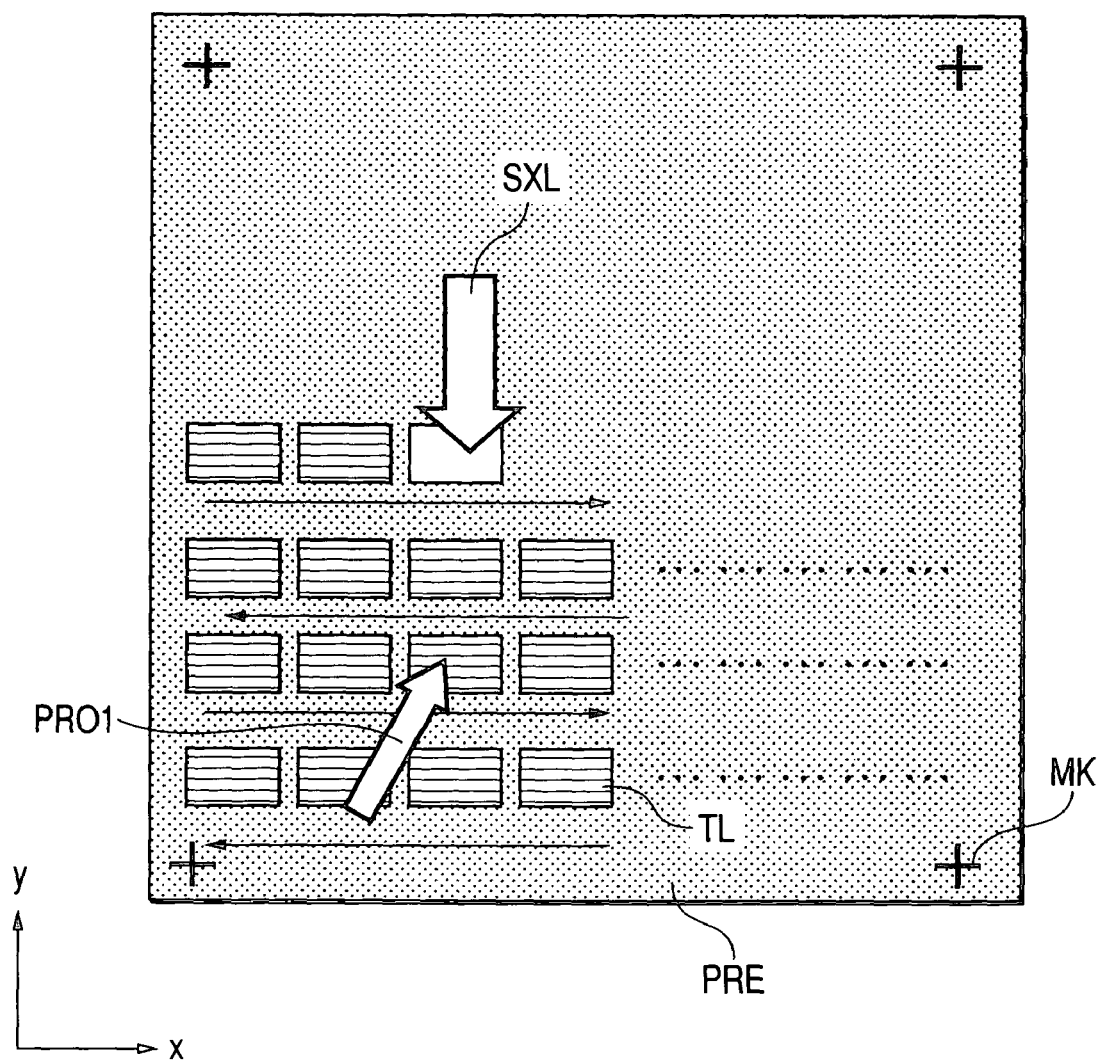
FIG. 3 is a diagram which illustrates how to form a semiconductor thin film on which lateral crystals are formed and disposed like titles at predetermined intervals in a given region according to a second embodiment of the present invention.

FIG. 3 illustrates how to form a semiconductor thin film in this second embodiment. In a given area of the semiconductor thin film, lateral crystals are formed. Those lateral crystals are disposed like tiles at predetermined intervals. It is also possible to skip one line from the region being currently laser-irradiated to evaluate the crystallization property of the thin film so that laser irradiation for crystallization and a crystallization property evaluation can be carried out more efficiently.

Figure 4A:
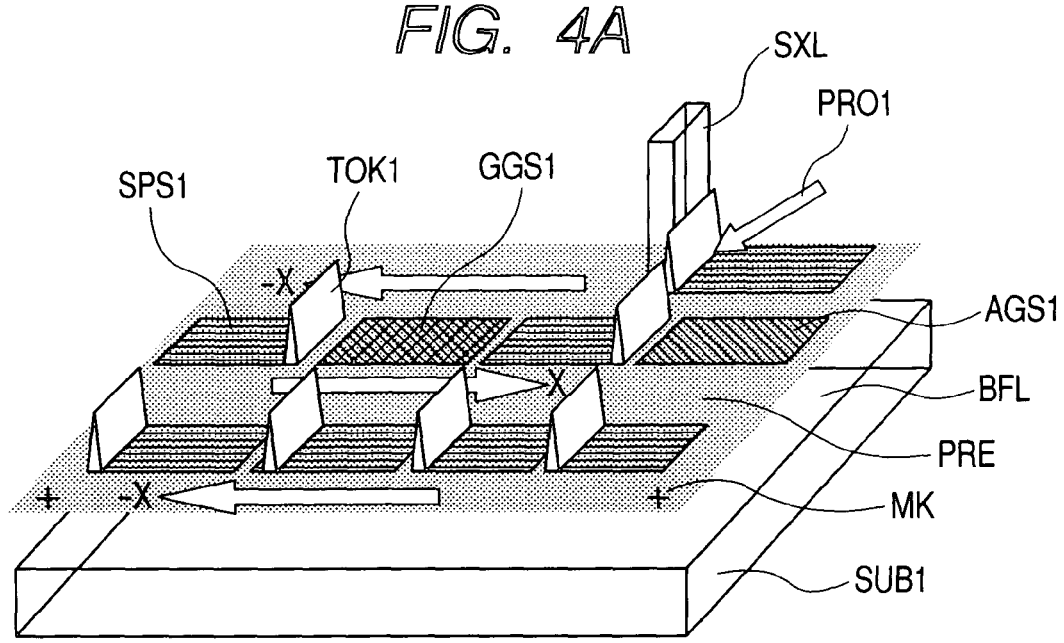
FIG. 4A is a diagram showing a process for forming a modified region (title) TL with a lateral crystal silicon film as a first example.
Figure 4B:
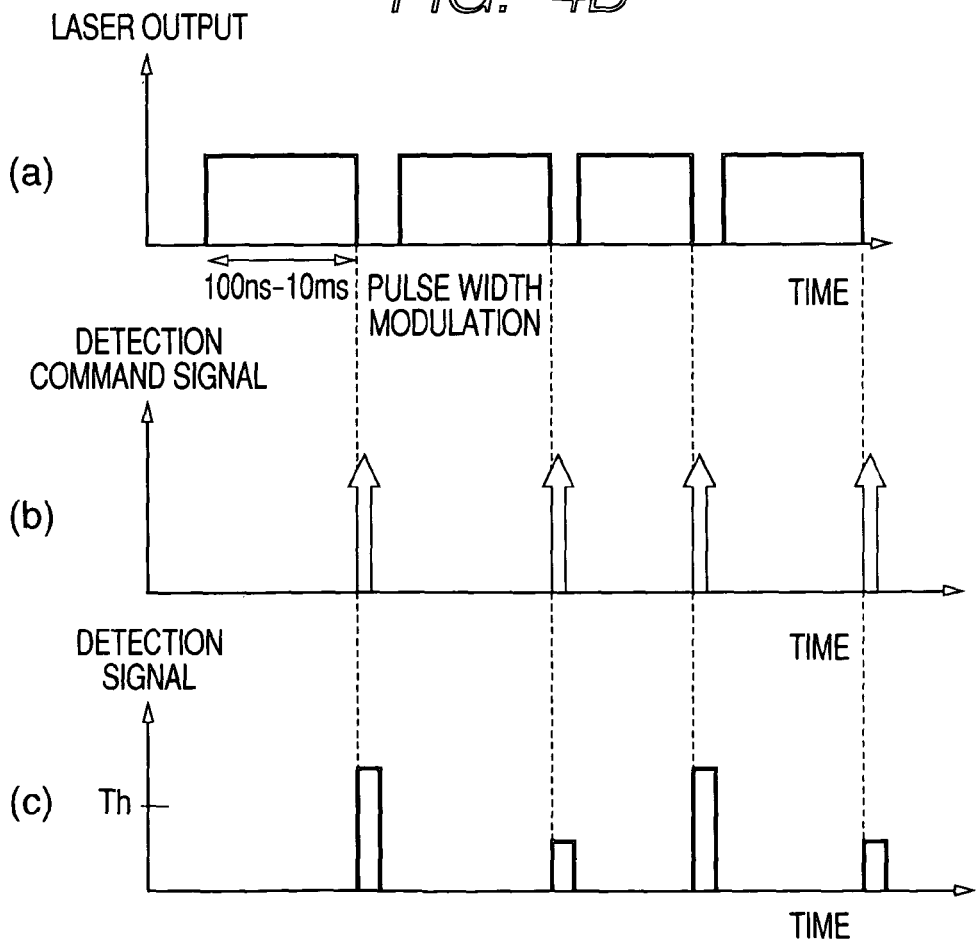
FIG. 4B illustrates various kinds of waveforms used in the forming process shown in FIG. 4A.

FIG. 4A is a diagram showing how to form modified regions (tiles) TL with a lateral crystal silicon film. FIG. 4B illustrates various kinds of waveforms which appear in the modified region forming process shown in FIG. 4A. In FIG. 4B, line (a) denotes an example of the output waveform of a laser beam on the basis of time line, (b) denotes an example of the waveform of the inspection command signal issued from the apparatus, and line (c) denotes an example of the waveform of a crystallization inspection signal.

In FIG. 4A, a precursor PRE is formed on the substrate SUB1 with a buffer layer BFL disposed therebetween. The laser beam SXL is irradiated to this precursor PRE. An arrow PRO1 denotes an inspection beam. Here, the laser beam SXL is given a pulse width of 100 ns to 10 ms, as shown in FIG. 4B at line (a).

In FIG. 4A, the time-based pulse width of the laser beam SXL is modulated to form an approximately band-like crystal silicon film SPS1SPS1 in a desired region by scanning the laser beam bidirectionally in the X and −X directions. The average grain size of the lateral crystal silicon film SPS1SPS1 thus becomes about 5 μm in the laser beam SXL scanning direction and about 0.5 μm in the direction vertical to the scanning direction (width between grains CB).

After that, the inspection beam PRO1 is aligned to the object so as to inspect the film crystallization just after the laser beam SXL is turned off. This is because a protrusion TOK1 is formed in each region on the silicon film where the laser beam SXL is turned off, if the silicon film has any lateral crystals SPS1SPS1. This protrusion TOK1 is not recognized if the silicon film has grain crystals GGS1 or an aggregated film AGSI. This is why the lateral crystals SPS1SPS1 can be monitored according to an inspection command signal issued from the manufacturing apparatus so as to detect the protrusion TOK1.

As shown in FIG. 4B at line (b), the film forming apparatus outputs a detection command signal when the laser beam SXL is turned off. The detection command signal is denoted with an arrow. The detection signal denoted in FIG. 4B at line (c) is detected synchronously with this detection command signal. In other words, the inspection beam PRO1 that is irradiated from a monitor light source MON is scattered by the silicon film. This scattered light is detected by a probe (not shown, a detector DET in FIG. 5 to be referred to later) synchronously with the output timing of the inspection command signal.

If a protrusion TOK1 is formed on a tile TL, that is, if a lateral crystal is formed in a tile TL, the inspection beam PRO1 will scatter more due to this protrusion TOK1, thereby the detection signal detected by the probe for detecting this scattered light will exceed a certain value. On the other hand, if no protrusion TOK1 is formed, that is, if a tile TL is in the grain crystal GCS1 state or aggregated crystal AGSI state, the inspection signal has a small value. FIG. 4B at line (c) denotes such an inspection signal value as a height of the signal. If the signal height exceeds a set value Th, it means that a protrusion TOK1 is formed in the object tile TL. In other words, it is determined that a lateral crystal has been formed in the tile TL.

As described above, the inspection signal value is detected according to whether or not a protrusion TOK1 exists in the end region of the object tile TL. Instead of this method, it is also possible to detect whether or not a lateral crystal is formed in the object tile TL by monitoring the anisotropy of the lateral crystal growth around the central portion of the tile TL. In that connection, it is just required to output an inspection command signal while the laser beam is being output to detect the scattering inspection beam with use of a probe.

The average grain size of the lateral crystal silicon film is about 5 μm in the laser beam SXL scanning direction and about 0.5 μm in the direction vertical to the scanning direction (width between grain boundaries CB). The grain size in the scanning direction can be varied according to such conditions as the energy, scanning speed, and pulse width of the laser beam SXL. On the contrary, the average grain diameter of the polysilicon film PSI is about 0.6 μm (0.3 to 1.2 μm). Such a difference between those crystal structures causes a significant difference in the electron mobility when each thin film transistor is configured with a polysilicon film PSI and a lateral crystal silicon film SPS1SPS1.

The above-described lateral crystal silicon film SPS1SPS1 should preferably have the following features.

(a) The main orientation to the surface is {110}.
(b) The main orientation of the face approximately vertical to the moving direction of carriers is {100}.

The two azimuths of features (a) and (b) can be evaluated by the electron beam diffraction method or EBSP (Electron Backscatter Diffraction is Pattern) method.

(c) The defect density of the film is lower than $1 \times 10^{17}$ cm$^{-3}$. The number of crystal defects in the film denotes a value that can be defined from electrical characteristics or a quantitative evaluation of unpaired electrons by electron spin resonance (ESR).

(d) The film hole mobility is 50 cm$^2$/Vs to 700 cm$^2$/Vs.

(e) The film thermal conductivity depends on temperature and takes the maximum value at a certain temperature. The thermal conductivity rises once when the temperature rises and takes a value between the maximum value 50 W/mK and 100 W/mK. In a high temperature region, the thermal conductivity goes down when the temperature falls. The thermal conductivity can be evaluated and defined using the 3-omega method or the like.

(f) The Raman shift evaluated and defined from the Raman scattered light of the thin film is 512 cm$^{-1}$ to 518 cm$^{-1}$.

(g) The distribution of the film crystal boundary $\Sigma$ value has the maximum value at $\Sigma 11$ and comes to be distributed as the gauss type one. The $\Sigma$ value can be measured using the electron beam diffraction method or EBSP (Electron Backscatter Diffraction Pattern) method.

(h) The optical constant of the film denotes a region that satisfies the following conditions. The diffraction n at a wavelength of 500 nm is 2.0 to 4.0 and the decay coefficient k is 0.3 to 1. And, the refractive index n at a wavelength of 300 nm is 3.0 to 4.0 and the decay coefficient k is 3.5 to 4. The optical constant is measured by a spectral ellipsometer.

A thin film transistor that uses an approximate band-like lateral crystal silicon film SPS1, as described above, comes to have both high performance and high reliability and is low in variation.

Figure 5:
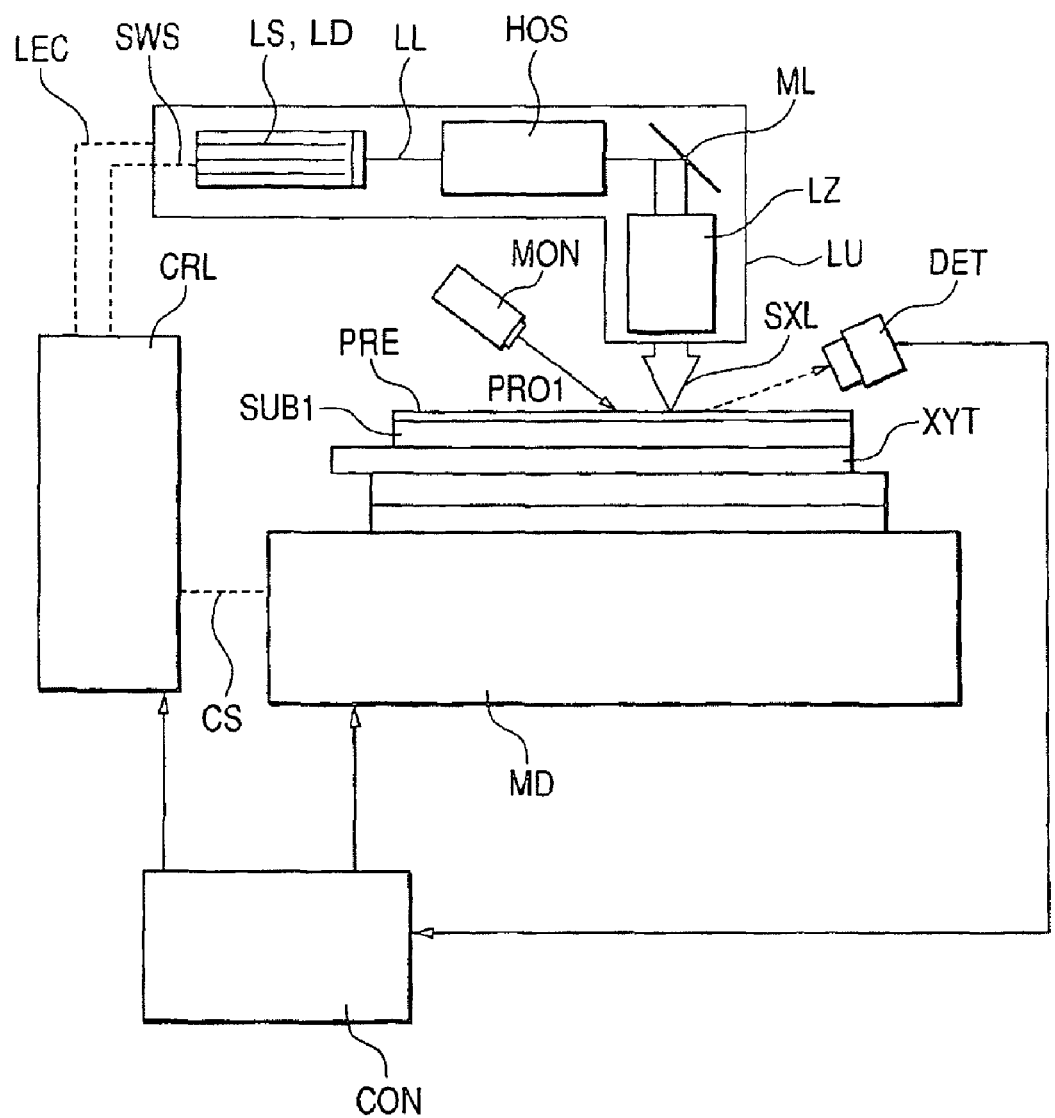
FIG. 5 is a block diagram of a semiconductor thin film forming apparatus used for both laser beam irradiation and inspection according to the present invention.

FIG. 5 is a block diagram of a semiconductor thin film forming device which is used for both laser irradiation and crystallization inspection according to the present invention. In this device, the glass substrate SUB1, on which a semiconductor precursor film PRE is formed, is placed on a stage XYT that is driven in the x-y direction and on which the position of the substrate is adjusted with use of a reference position measuring camera (not shown). The marks MK are used as targets for the positioning. The reference position measuring signal LEC which is output from the reference position measuring camera is inputted to a controller CRL and is used for fine-adjustment of the irradiation position according to the control signal CS that is inputted to a driving facility MD to move the stage XYT at a predetermined speed to scan the laser beam in one direction. The laser beam SXL, which is output from an irradiation facility LU, is irradiated to the precursor PRE of the amorphous silicon or polysilicon film according to the control signal SWS, synchronized with the scanning. Thus, the film is modified to the lateral crystal silicon film SPS1 shown in FIG. 1A.

The irradiation facility LU includes, for example, a continuous oscillation (CW) solid state laser oscillator LS excited by a semiconductor diode (LD), an optical system HOS for inputting a laser output LL from the oscillator LS, a reflection mirror ML, and a condensing lens system LZ to form an irradiation laser beam having a desired beam width, beam length, and intensity distribution. The optical system HOS includes a beam homogenizer and a modulator (ex., EO/AO modulator) for performing temporal modulation is of the continuous oscillation laser at a predetermined pulse width and/or at pulse intervals.

If the laser beam scanning speed is reduced, a thin laser beam, for example, under 10 μm, is required. That is mainly realized with a condensing lens system LZ. Although the condensing lens system LZ is not necessarily required to achieve the present invention, such insertion of the condensing lens system LZ makes it easier to achieve the present invention. The homogenizer, if it is provided with a diffraction optical element, can make the intensity distribution more uniform, thereby suppressing the loss of the laser beam. The laser beam is irradiated while moving the moving stage in a direction orthogonal to the longitudinal direction of the linear beam, that is, in the linear beam width direction. A driving device is used to move the moving stage, and a control system CON is used to control the stage.

The film quality is checked as follows. At first, an inspection beam PRO1, which is output from the laser inspection beam source MON, is irradiated to the modified crystal silicon film SPS1 to measure the scattered light or reflection light from the film, or the intensity of the diffraction light, with use of a detector DET. The wavelength of the inspection beam is 200 nm to 700 nm and the inspection beam is injected into the substrate from its surface at an angle α. As described with reference to table 1, FIG. 1A, and FIG. 1B, if the protrusion TOK1 formed in the end region of each lateral crystal is to be determined to evaluate the film quality, the scattering light at the protrusion TOK1 is measured, thereby the measuring accuracy is improved.

The scattered light should preferably be detected on the basis of the intensity thereof using a detector DET disposed outside the path of the direct is reflection light to be returned due to the crystallized region. A control system CON provided for the film forming device corrects the operation state set data that includes the output energy, irradiation time, substrate scanning speed, and laser beam profile of the laser oscillator LS according to the measured data.

The controller CRL controls the irradiation time, radiation intensity, etc. of the laser beam SXL. In addition, the controller CRL changes both the pulse width and the pulse interval as a set corresponding to both the length and interval of each modified region TL in which a lateral crystal is formed. The modified regions TL formed such a way are also referred to as tiles TL, as described above, since they are arranged like tiles.

Figure 6:
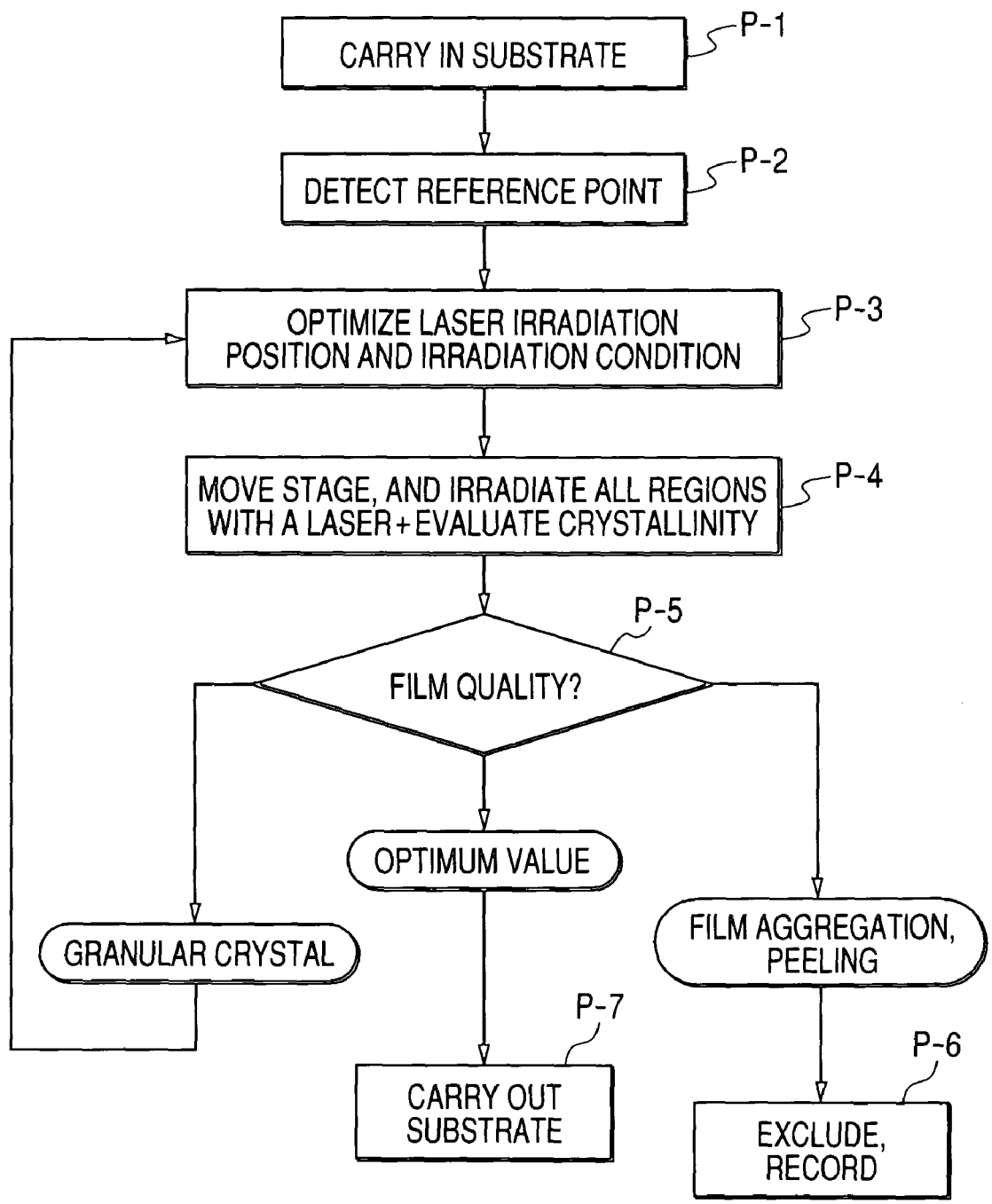
FIG. 6 is a flowchart of a laser irradiation process that uses the semiconductor thin film forming apparatus shown in FIG. 5.

FIG. 6 shows a flowchart providing an example of a laser irradiation process with use of the semiconductor thin film forming device shown in FIG. 5. Here, the insulated substrate is just described as a substrate. At first, the substrate is carried in (P-1), set on the driving stage XYT, and then held by fixing means such as a vacuum chuck. Then, reference points are detected in that state (P-2). After that, such data as the laser irradiation point, irradiation conditions, etc. are inputted to the irradiation device.

More specifically, the input items are those used for setting the laser output (ND filter adjustment, etc.), the crystallizing position (position of the substrate on the driving stage XYT), the crystallizing distance (length of each tile TL in the crystallizing direction), the intervals (between tiles TL), the number of tiles (to be created), each data item for adjusting the slit width in the laser beam path, and the objective lens. The crystallization distance, the interval between tiles TL, and the number of tiles TL are set for the AO or EO modulator. After the input of those conditions, the laser beam profile, power monitor, laser beam irradiation position, etc. are confirmed.

When the insulated substrate is prepared and the condition inputs are confirmed, the surface height of the insulated substrate is measured and the stage is moved while the laser beam is irradiated. While the laser beam is irradiated, both the scanning distance and the irradiation position of the substrate are fed back to the condition input device. The inspection beam is irradiated to the substrate as soon as the laser beam irradiation begins, thereby measuring, inspecting, and evaluating the crystal state in real time (P-4).

When crystallization by laser beam and crystallization property inspection (P-4) are completed for all the regions of one substrate, the next process is determined according to the inspection result of each tile TL (P-5). In other words, if it is determined from the crystal state that granular crystal regions are present, control returns to (P-3). Then the laser irradiation conditions are optimized, the laser beam is irradiated to the substrate again and the inspection beam is irradiated to the substrate to evaluate the crystallization property. This process sequence is repeated until granular crystal disappears from every tile region of the substrate. If aggregation and/or peeling is recognized on any tile TL, the tile position is recorded to exclude the tile TL from the subsequent processes (P-6).

When it is determined that the crystallization property satisfies the optimum criterion, the fixing means, such as a vacuum chuck, etc. that holds the substrate, is released to enable the insulated substrate to be taken out of the driving stage XYT. Hereinafter, the next substrate is set on the driving stage XYT (P-7) to repeat the above process sequence a necessary number of times. The processes can thus be executed at a high throughput and at a high yield.

Figure 7:
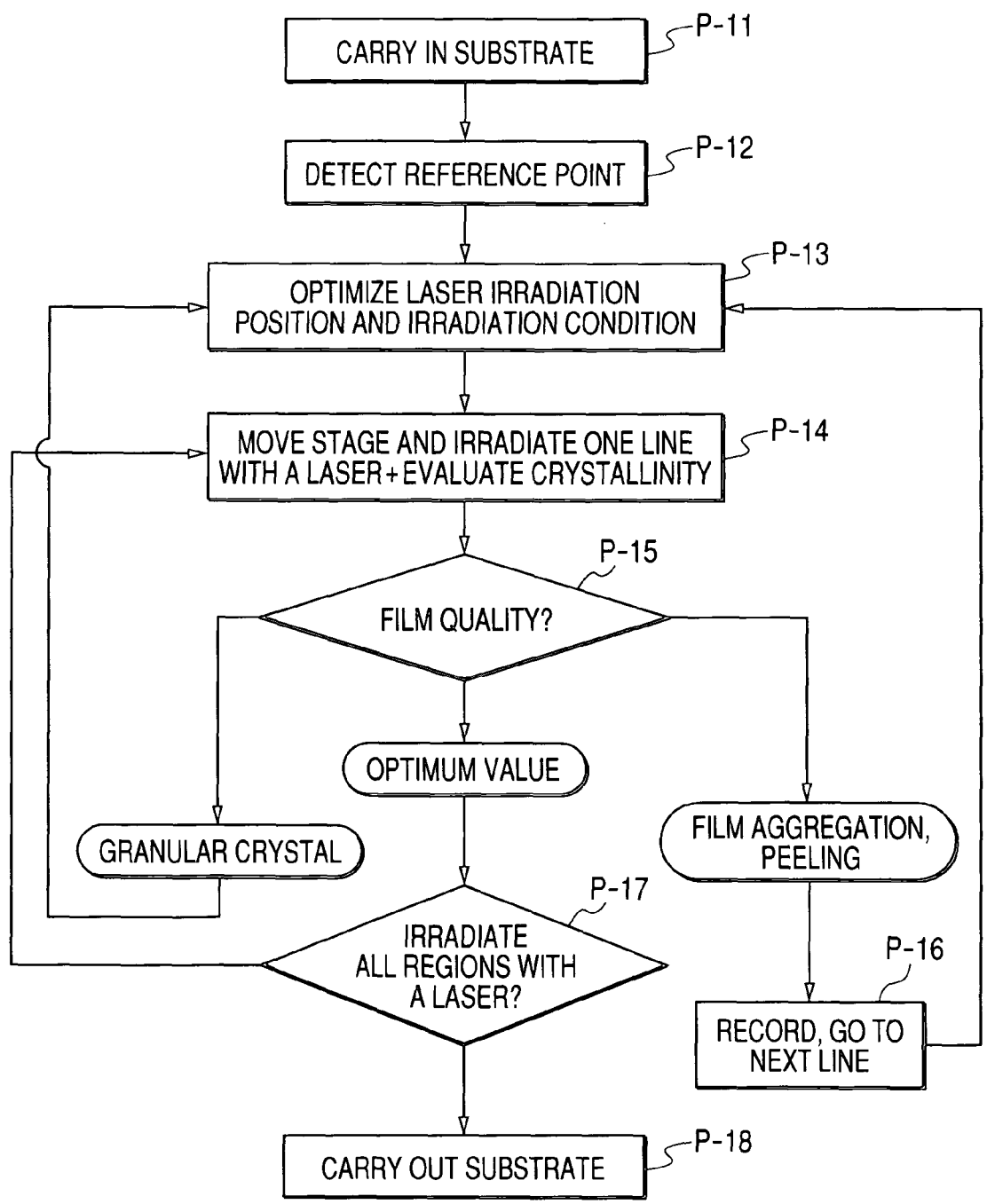
FIG. 7 is a flowchart of a laser irradiation process that uses the apparatus shown in FIG. 5 as a second example.

FIG. 7 is a flowchart of a laser irradiation process sequence that uses the film forming device shown in FIG. 5 in the second embodiment of the present invention. This laser irradiation process is characterized in that the crystallization property is inspected at each line irradiation during the laser beam scanning on the target insulated substrate, and then the inspection data is fed back. In that connection, both crystallization and inspection are carried out for each line at the same time, and then the result is checked. If the result indicates the presence of granular crystal, the crystallization process is executed again immediately. If aggregation and/or film peeling is recognized on the substrate film, the result is recorded, and then the laser beam is irradiated to the next line.

In FIG. 7, a substrate is carried-in (P-11), set on the driving stage XYT, and held by fixing means, such as a vacuum chuck. Then, the reference points on the substrate are detected (P-12). After that, data such as the laser irradiation position, irradiation condition, etc. are inputted to the irradiation device (P-13). Those input items are the same as those shown in FIG. 5.

When the object insulated substrate is prepared and the condition inputs are confirmed, the surface height of the insulated substrate is measured. Then, the laser beam is irradiated to one scanning line on the substrate while the stage is moved. While the laser beam irradiation is continued, both the scanning distance and the irradiation point of the is substrate are fed back to the condition input device; this process is just like that shown in FIG. 5. The irradiation of both the laser beam and the inspection beam to this one line is carried out at the same time to measure, inspect, and evaluate the crystallization state in real time (P-14).

When the crystallization of one line by laser irradiation and the crystallization property inspection (P-14) are completed, the next process is determined according to the inspection result of each tile TL in the one line (P-15). In other words, if the determination result indicates the presence of a granular crystal region, control returns to (P-13), then the laser irradiation conditions are optimized. Then, both of the laser beam and the inspection beam are irradiated at the same time to evaluate the crystallization property. This sequence of processes is repeated until the granular crystal disappears from every tile of the one line of the substrate. If film aggregation and/or peeling is recognized on any tile TL, the position of the tile TL is recorded, and then control returns to (P-13) to exclude the tile TL from the subsequent processes. After that, the laser irradiation for the next one line begins (P-16).

When the crystallization property for all the regions of the object substrate, that is, for every line, is determined so as to satisfy the optimum criterion (P-17), the fixing means, such as a vacuum chuck or the like that holds the substrate, is released to enable the insulated substrate to be taken out of the driving stage XYT (P-18). Then, the next substrate is set on the driving stage XYT and the above processes are repeated a necessary number of times. The processes are thus executed at a high throughput and at a high yield.

While each line is inspected and the inspection result is fed back in this is second embodiment, it is also possible to inspect each region, for example, a set of five lines, or as a block (a set of tiles on the object substrate) and feed back the inspection result to obtain the same effect.

Third Embodiment

Figure 8:
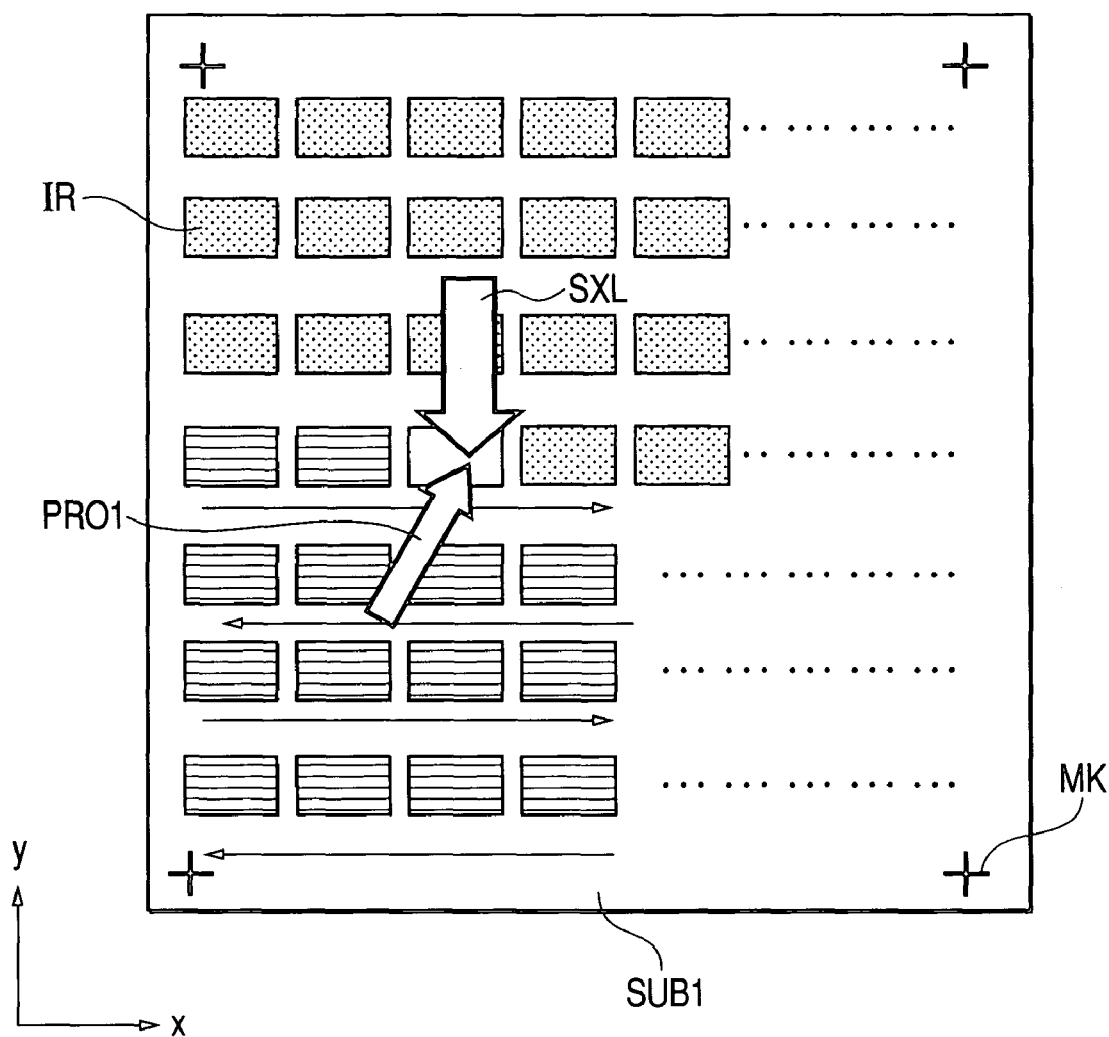
FIG. 8 is a diagram which illustrates how to form a semiconductor thin film, on which lateral crystals are formed and disposed at predetermined intervals in a given region of the thin film, in accordance with the second embodiment of the present invention.
Figure 9A:
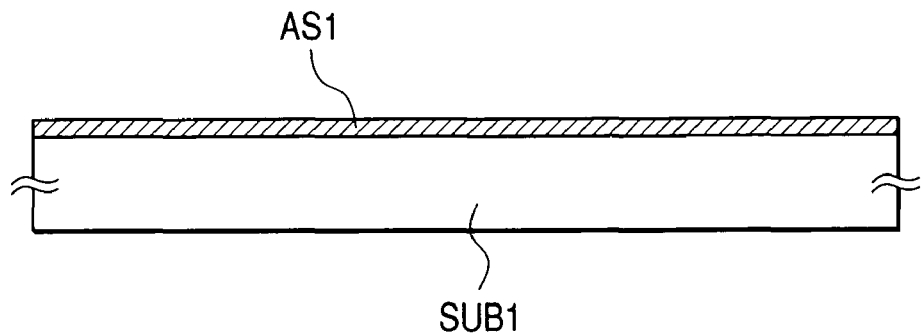
FIG. 9A is a diagrammatic sectional view showing a step in the manufacture of an image display device.
Figure 9B:
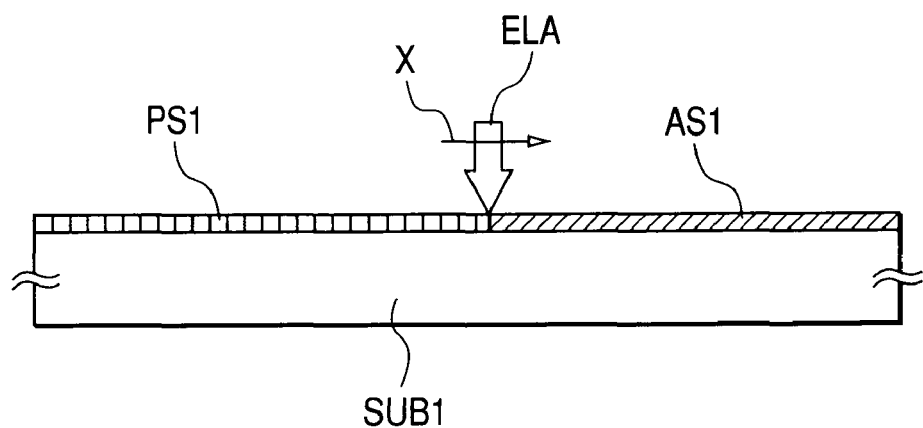
FIG. 9B is a diagrammatic sectional view showing a step in the manufacture of the image display device following the step of FIG. 9A.
Figure 9C:
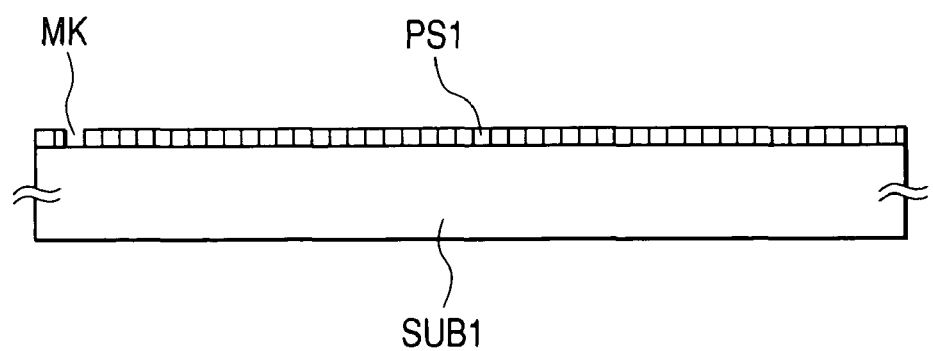
FIG. 9C is a diagrammatic sectional view showing a step in the manufacture of the image display device following the step of FIG. 9B.
Figure 10A:
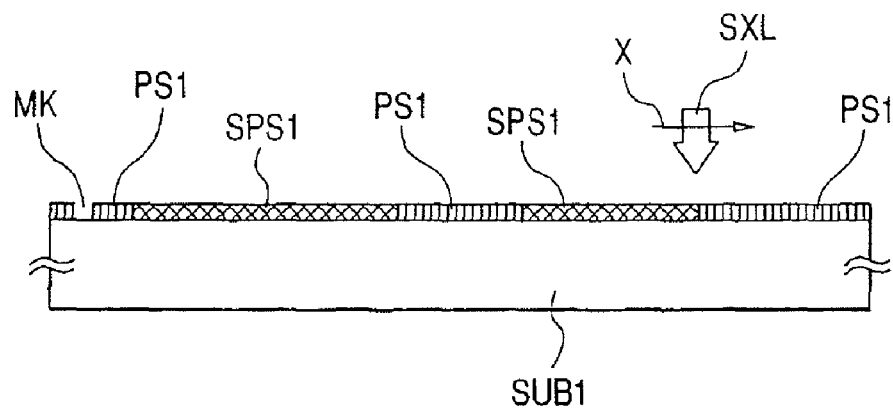
FIG. 10A is a diagrammatic sectional view showing a step that follows the step shown in FIG. 9C in the manufacture of the image display device.
Figure 10B:
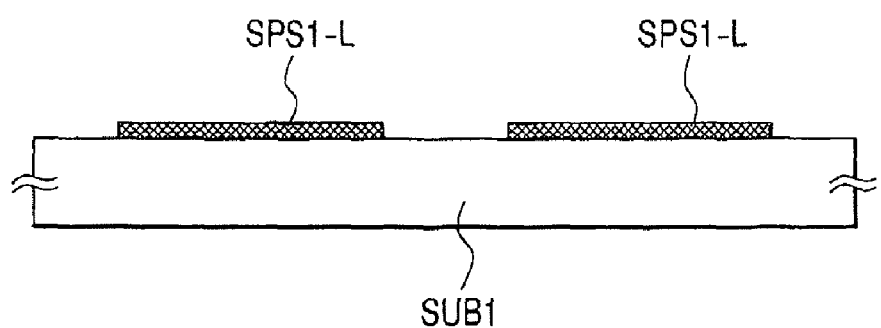
FIG. 10B is a diagrammatic sectional view showing a step that follows the step shown in FIG. 10A in the manufacture of the image display device.
Figure 10C:
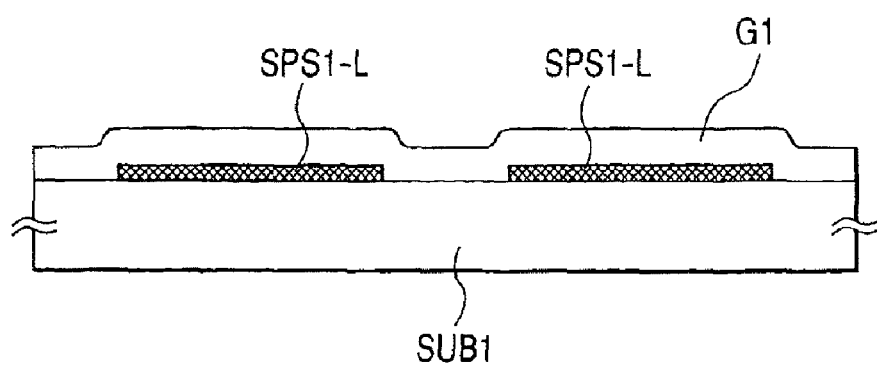
FIG. 10C is a diagrammatic sectional view showing a step that follows the step shown in FIG. 10B in the manufacture of the image display device.
Figure 11A:
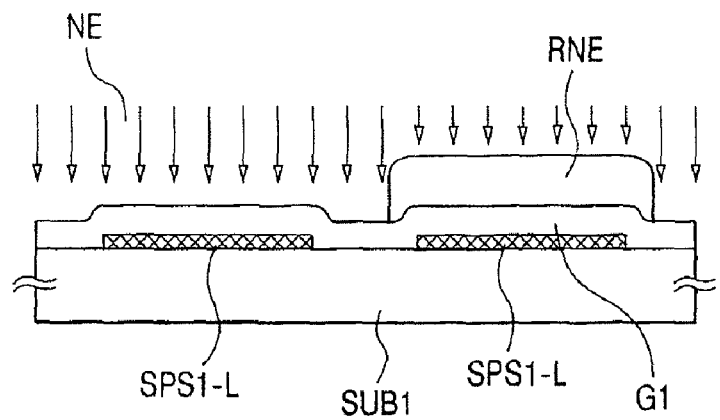
FIG. 11A is a diagrammatic sectional view showing a step that follows the step shown in FIG. 10C in the manufacture of the image display device.
Figure 11B:
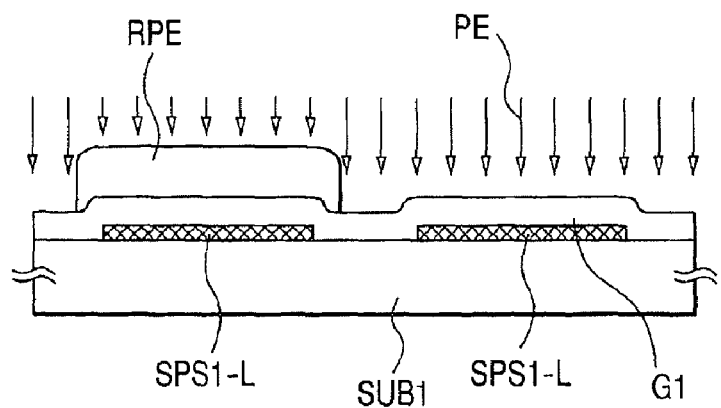
FIG. 11B is a diagrammatic sectional view showing a step that follows the step shown in FIG. 11A in the manufacture of the image display device.
Figure 11C:
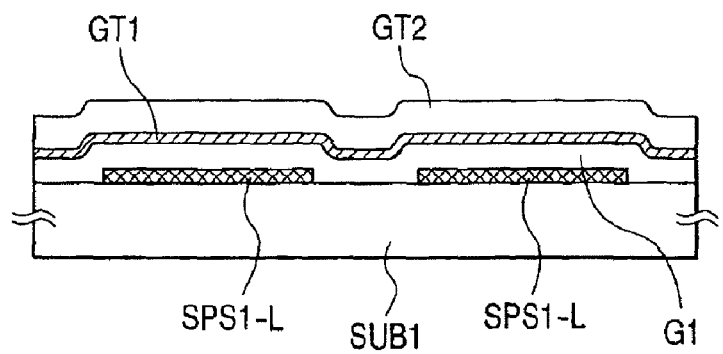
FIG. 11C is a diagrammatic sectional view showing a step that follows the step shown in FIG. 11B in the manufacture of the image display device.
Figure 12A:
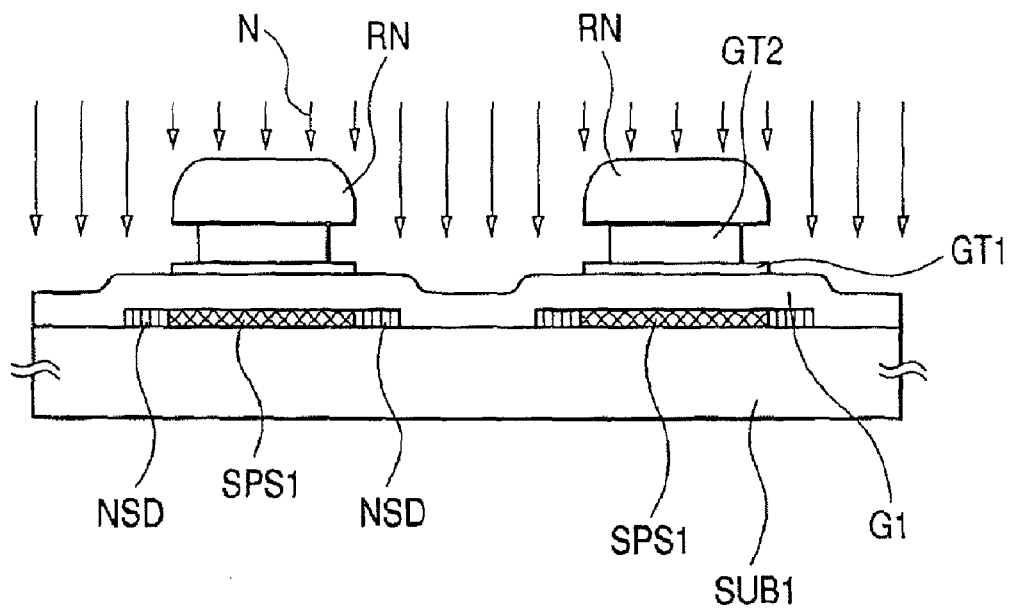
FIG. 12A is a diagrammatic sectional view showing a step that follows the step shown in FIG. 11C in the manufacture of the image display device.
Figure 12B:
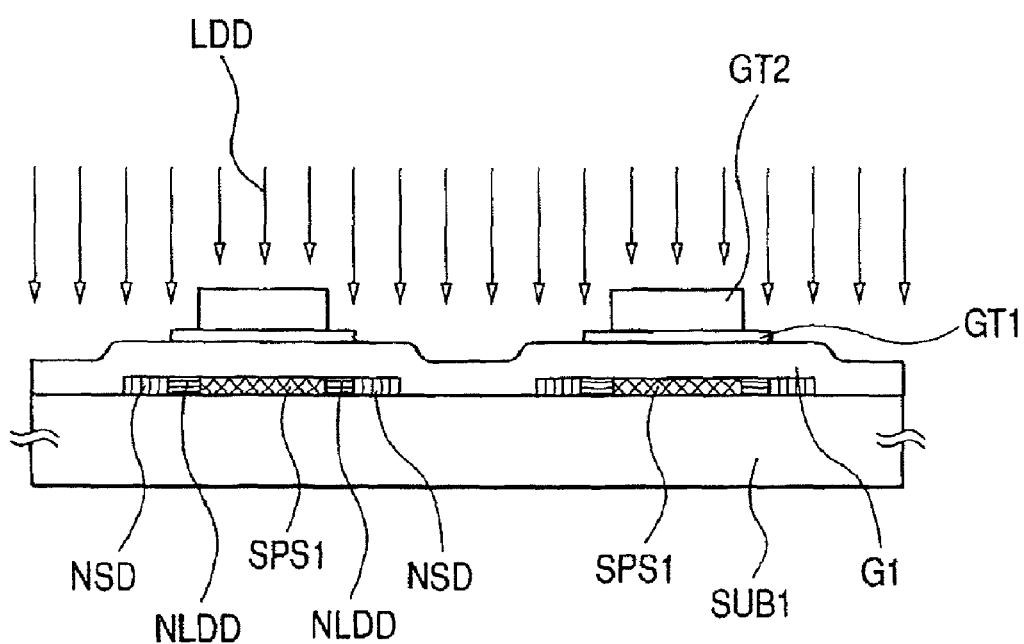
FIG. 12B is a diagrammatic sectional view showing a step that follows the step shown in FIG. 12A in the manufacture of the image display device.
Figure 13A:
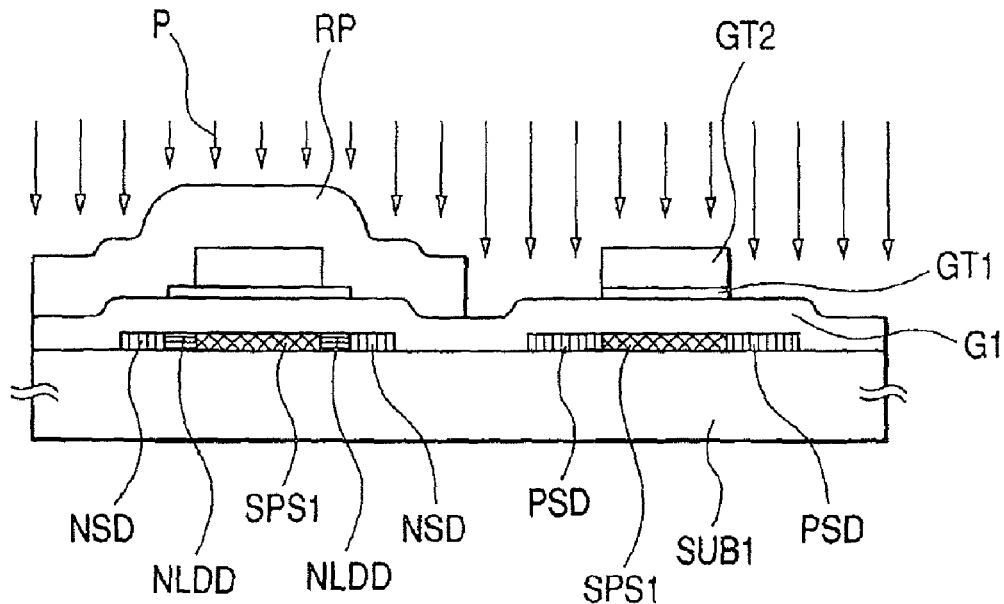
FIG. 13A is a diagrammatic sectional view showing a step that follows the step shown in FIG. 12B in the manufacture of the image display device.
Figure 13B:
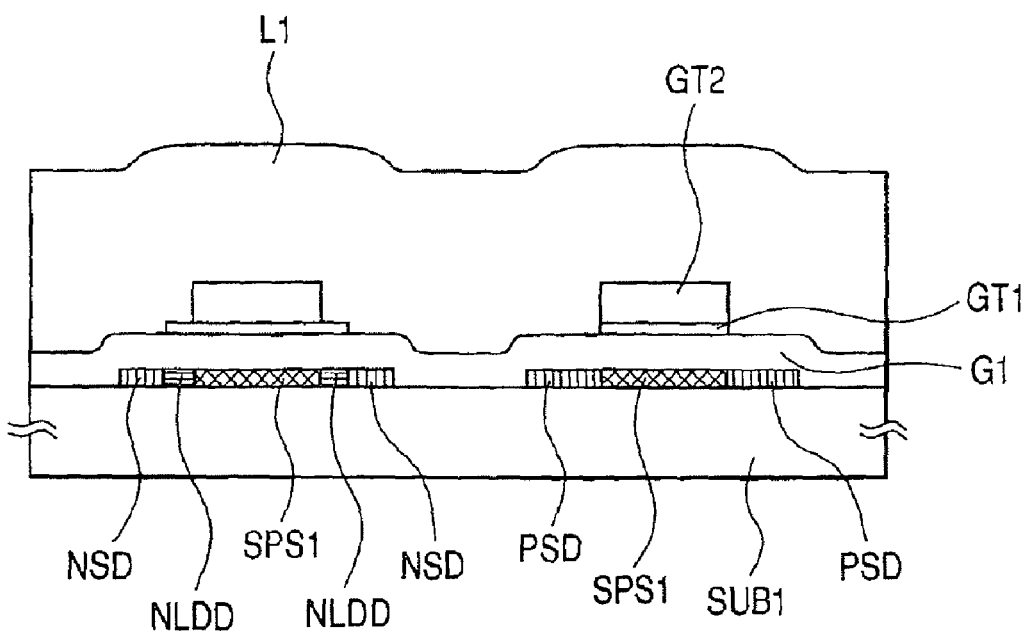
FIG. 13B is a diagrammatic sectional view showing a step that follows the step shown in FIG. 13A in the manufacture of the image display device.
Figure 14:
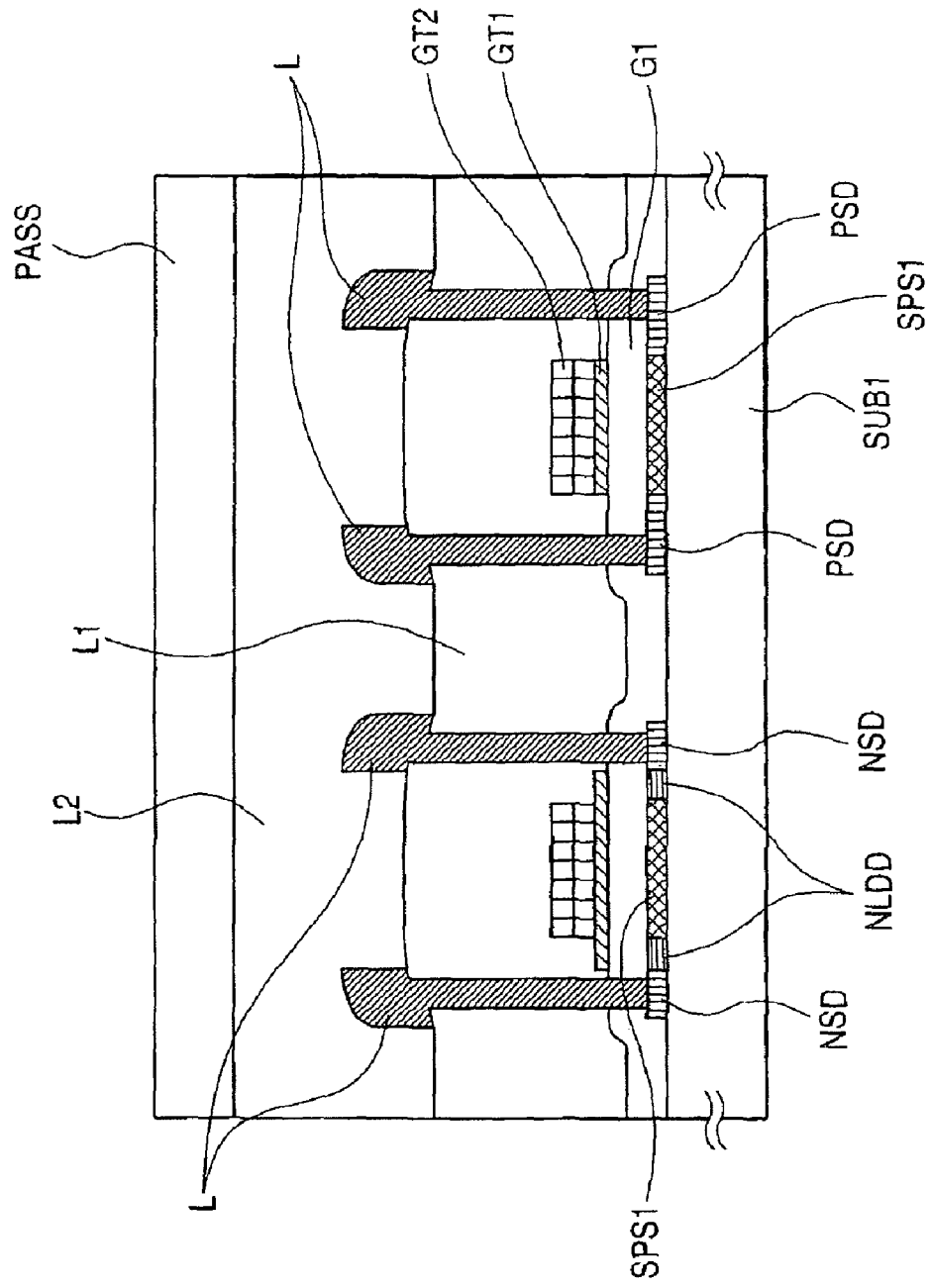
FIG. 14 is a diagrammatic sectional view showing a step that follows the step shown in FIG. 13B in the manufacture of the image display device.

FIG. 8 illustrates how to form a semiconductor thin film having lateral crystals formed like tiles which are disposed at predetermined intervals in a given region in the second embodiment of the present invention. Just like the formation of a semiconductor thin film as shown in FIG. 4A, a plurality of precursors PRE are formed with amorphous or polysilicon like islands or lines beforehand with a given size and in a given region on the buffer layer BFL provided on the insulated substrate SUB1. A laser beam SXL having a width W of 5 μm is irradiated to those island-shaped or linearly-shaped precursors IR while scanning the substrate at a speed of 0.5 m/s in the x direction, then in the y direction, and then in the −x direction, to form island-shaped or linearly-shaped modified regions TL having lateral crystals in the scanning x and −x directions. And, a protrusion is formed at the end (end region) of each island-shaped precursor IR in the scanning direction.

Each insulated substrate SUB1 has positioning marks MK used as positioning targets for scanning the substrate with the laser beam SXL. In the second embodiment, the laser beam time modulation is not always required.

In the second embodiment, the semiconductor thin film is shaped like islands or lines before the laser beam irradiation thereto. The beam length in the direction orthogonal to the laser beam scanning direction is greater than or equal to the size of the island-shaped or linearly-shaped semiconductor thin films in the direction orthogonal to the scanning direction. In that connection, however, film aggregation tends to occur more easily at the end regions of the semiconductor thin films more than in the first method shown in FIGS. 2 and 3. The thin film thus comes to be occupied widely by ineffective regions having crystallization properties unsuitable for thin film transistors. Much care should be given to the thin film. The laser beam may be irradiated to two or more island-shaped or linearly-shaped thin films at the same time.

Whether to form one thin film transistor in one modified region TL or a plurality thin film transistors in one modified region TL may be determined freely.

Next, a description will be given of a specific example of how to manufacture an image display device of the present invention with reference to FIGS. 9A through 14. It is premised here that CMOS thin film transistors are to be manufactured and that an N-type thin film transistor is formed with a self-aligned GOLDD (Gate Overlapped Light Doped Drain) and a P-type thin film transistor is formed by counter doping. Hereinafter, a description of a series of steps, as illustrated in FIG. 9A through FIG. 14, will be set forth.

At first, a heat-resisting glass substrate SUB1 is prepared as an active matrix substrate having a thickness of 0.3 mm to 1.0 mm. The substrate SUB1 should preferably have a resistance to deformation and contraction in thermal processes under 400° C. to 600° C. More preferably, an SiN film of about 140 nm and an SiO film of about 100 nm in thickness should be deposited on this glass substrate SUB1 consecutively and uniformly using the CVD method, so that both films function as thermal and chemical barriers. Then, an amorphous silicon film AS1 is formed on this substrate SUB1 using the CVD method, for example, shown in FIG. 9(A)

After that, an excimer laser beam ELA is scanned in the x direction to fuse and crystallize the amorphous silicon film AS1 to modify the whole amorphous silicon film AS1 on the glass substrate SUB1 to a polysilicon film, that is, a polysilicon film PSI. See FIG. 9(B)

The excimer laser beam processing may be replaced with another type, for example, solid state laser annealing to crystallize the object film. A Cat-CVD film/SiGe film to become a polysilicon film when the object silicon film is formed may also be adopted.

After that, the positioning marks MK are formed by laser annealing. The marks MK are used as targets for determining the irradiation position of a laser beam SXL, such as a pulse modulated laser to be described later (a pulse width modulated laser is to be used here.) See FIG. 9(C)

By referring to the marks MK the pulse modulated laser beam SXL is scanned in the x direction to select each predetermined region to be irradiated intermittently. This selective irradiation enables the polysilicon film PSI to be modified, thereby forming approximate band-hike crystal silicon film tiles SPS1 having consecutive grain boundaries in the scanning direction. See FIG. 10(A)

Then, the approximate band-like crystal silicon film tiles SPS1 are to treated to form islands SPS1-L with use of a photo-lithography method. In each of the islands SFSI-L, a thin film transistor is formed. See FIG. 10(B)

Then, a gate insulation film G1 is formed so as to cover the islands SPS1-L of the tile silicon film SPS1. See FIG. 10(C)

Implantation NE is performed in each region in which an N-type thin transistor film is to be formed. The implantation NE is used to control the threshold value of the region. At that time, each region in which a P-type thin film transistor is to be formed is covered with photo-resist RNE. See FIG. 11(A) After that, implantation PE is performed in each region in which a P-type thin film transistor is to be formed. In that connection, the region is covered with photo-resist RPE. See FIG. 11(B)

Then, metallic gate films GT1 and GT2 are formed in two layers on each region in which a P-type thin film transistor is to be formed. The films GT1 and GT2 are to be used as thin film transistor gate electrodes. See FIG. 11(C)

The region in which metallic gate films GT1 and GT2 are formed is covered with photo-resist RN, then the metallic gate films GT1 and GT2 are patterned using the photolithography method. In that connection, the metallic gate film GT2 in the upper layer is side-etched by a required amount to shrink back more than the metallic gate film GT1 in the lower layer. In that state, an N-type impurity N is implanted to form an N-type thin film transistor source/drain region NSD using the photo-resist RN as a mask. See FIG. 12(A)

The photo-resist RN is then peeled off and implantation LDD is performed to form an N-type thin film transistor LSS region NLDD using the metallic gate film GT2 as a mask. See FIG. 12(B)

The region in which the N-type thin film transistor is formed is covered with photo-resist RP, then a P-type impurity P is implanted into the region in which a P-type thin film transistor source/drain is to be formed to form a P-type thin film transistor source/drain region PSD. See FIG. 13(A)

The photo-resist RP is then peeled off to activate the implanted impurity. After that, an interlayer insulation film L1 is formed using the CVD method or the like. See FIG. 13(B)

After that, contact holes are formed in the interlayer insulation film L1 and the gate insulation film G1 using the photolithography method, and a wiring metallic layer is connected to the source/drain NSD/PSD of each of the N-type and P-type thin film transistors through one of those contact holes to form a wiring L. An interlayer insulation film L2 is formed on this wiring L to form a protective insulation film PASS thereon. See FIG. 14

As shown in FIG. 1C, each grain boundary CB between single crystals of the approximate band-like crystal silicon film of the silicon islands exists so as to be oriented approximately in the same direction as the crystallizing direction CGR. And, the source electrode SD1 and the drain electrode SD2 are formed at positions so as to oppose to this crystallizing direction CGR. The direction of the current (channel current) Ich that flows between the source electrode SD1 and the drain electrode SD2 is set approximately in parallel to the crystallizing direction CGR. Because both of the crystallizing direction CGR and the current Ich direction are set as the same such way, the electron mobility in the channel is much more improved.

A CMOS thin film transistor is thus formed in each approximate band-like crystal silicon film tile SPS1. Generally, the N-type thin film transistor is often degraded significantly. This degradation is eased, however, if a low concentration impurity region LDD (Light Doped Drain region) is formed between the channel and the source/drain region. The GOLDD is structured so that a gate electrode covers the low concentration impurity region. In that connection, the performance degradation to be observed in the LDD is eased. When compared with the N-type thin film transistor, the P-type thin film transistor is not degraded so much. Therefore, none of the low concentration impurity regions LDD and GOLDD is usually adopted.

As described above, because the polysilicon film is modified so as to have larger crystals and the crystallizing direction is aligned to the channel direction, the source-drain current can be suppressed from crossing grain boundaries. This is why the operation of the thin film transistor is speeded up, thereby to realize the optimal thin film transistor circuit. And, such a thin film transistor circuit can be disposed as a driving circuit of an image display device.

The performance of the thin film transistor realized in such a way can assure a field effect mobility of about 300 $cm^2/V \cdot s$ and suppress variation of the threshold voltage under ±0.2 V at the time of creating N-channel MIS transistors. This is why the present invention can provide a display device that uses an active matrix substrate that assures high performance and high reliability in operations and is excellent in uniformity among devices.

Figure 15:
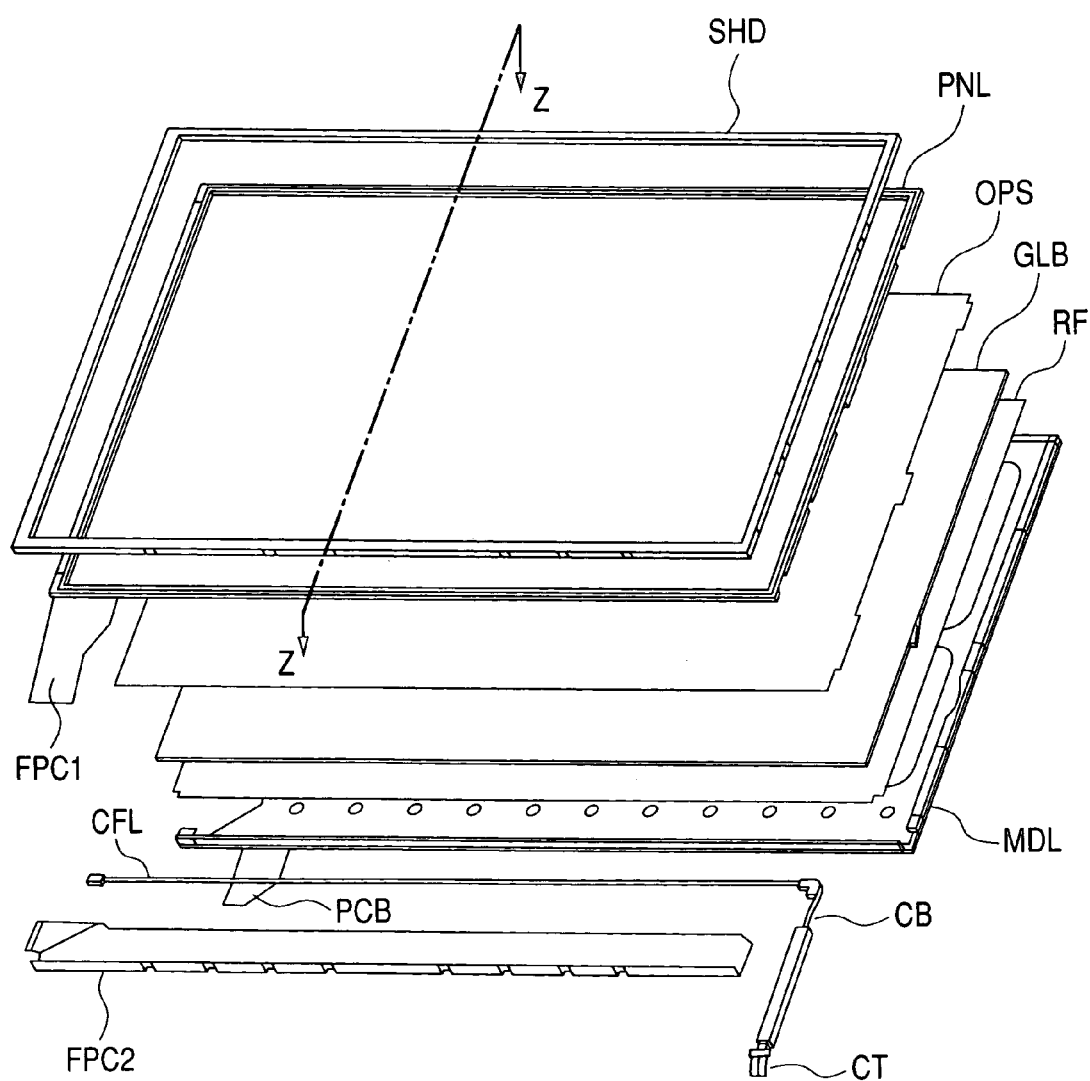
FIG. 15 is a developed perspective view of a liquid crystal display device representing an example of an image display device that uses thin film is transistors made of a semiconductor film in accordance with the method of the present invention.
Figure 16:
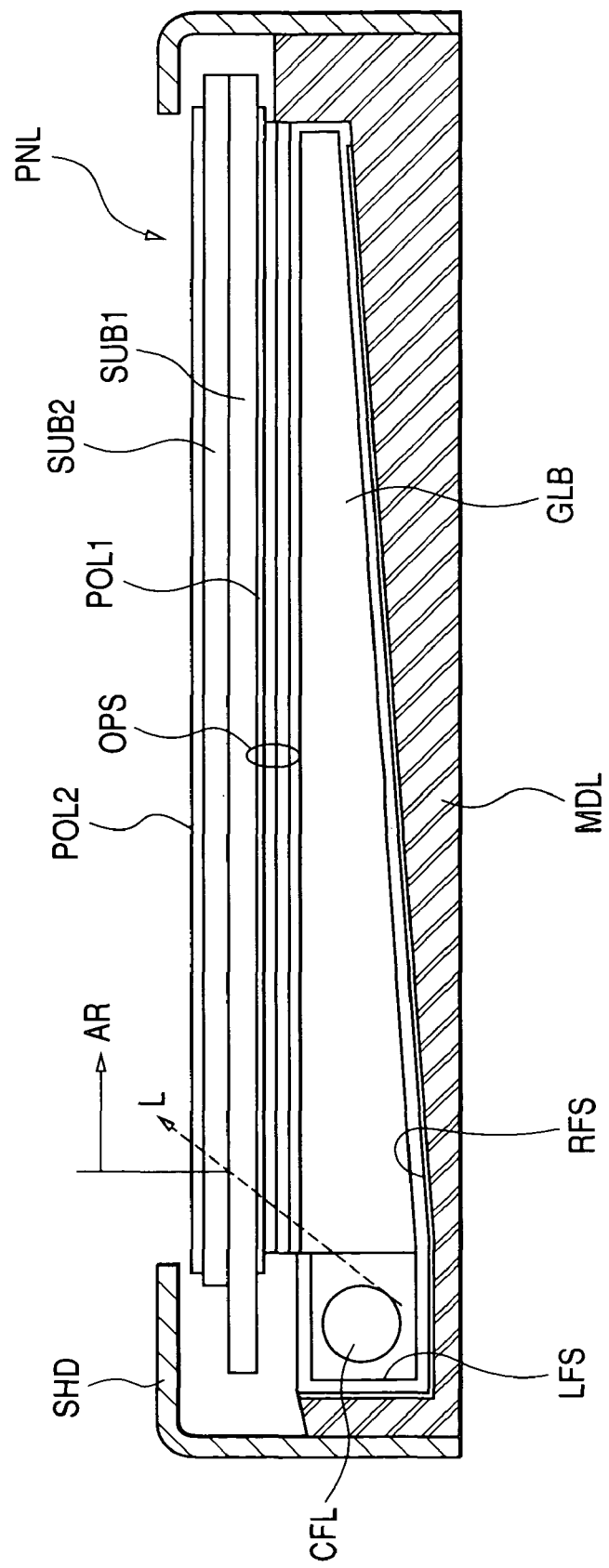
FIG. 16 is a cross sectional view of the liquid crystal display as seen on line Z-Z in FIG. 15.

FIG. 15 is a developed perspective view of a liquid crystal display device representing a first example of an image display device that uses an insulated substrate that includes thin film transistors manufactured using a semiconductor film according to the present invention. FIG. 16 is a sectional view of the liquid crystal display device taken along line Z-Z in FIG. 15. This crystal liquid display device is manufactured by employing the above-is described active matrix substrate. In FIGS. 15 and 16, reference symbol PNL denotes a liquid crystal cell formed by sealing liquid crystal in a gap between the active matrix substrate SUB1 and a color filter substrate SUB2. Polarizing plates POL1 and POL2 are laminated on the face and back of the liquid crystal cell, respectively. Other reference symbols are defined as follows; OPS denotes an optical compensation member, GLB denotes a light guiding plate, CFL denotes a cold cathode fluorescent lamp, RFS denotes a reflection sheet, LFS denotes a lamp reflection sheet, SHD denotes a shield frame, and MDL denotes a mold case.

Then, a liquid crystal alignment film layer is formed on the active matrix substrate SUB1 having thin film transistors manufactured with any of the above-described methods of the present invention and an alignment restricting power is applied to the alignment film layer, for example, by means of rubbing. After that, a sealing material is provided around the pixel region AR, and a color filter substrate SUB2, on which an alignment film layer is formed as described above, is disposed so as to face the substrate SUB1 with a predetermined gap therebetween and liquid crystal is sealed in this gap. Finally, the sealing port is sealed with a sealing material. Then, polarizing plates POL1 and POL2 are laminated on the face and back of the liquid crystal cell PNL, respectively, and a back-light or the like having a light guiding plate GLB, a cold cathode fluorescent lamp CFL, etc. is mounted with an optical compensation member OPS therebetween to constitute the liquid crystal display device. The driving circuit provided around the liquid crystal cells receives data and timing signals through flexible printed boards FPC1 and FPC2. Reference symbol PCB denotes a timing converter or the like provided between an external signal source and each of the flexible printed boards FPC1 and FPC2. The timing converter converts display signals inputted from the external signal source to signals to be displayed by the liquid crystal display device.

The liquid crystal display device that uses the active matrix substrate in this embodiment has an excellent polysilicon thin film transistor circuit disposed in the pixel circuit. Therefore, the liquid crystal display device is excellent in current driving performance and suitable for fast operations. Furthermore, because the threshold voltage variation in the liquid crystal display device is small, the device is excellent in uniformity of image quality and can be provided at a low price.

Figure 17:
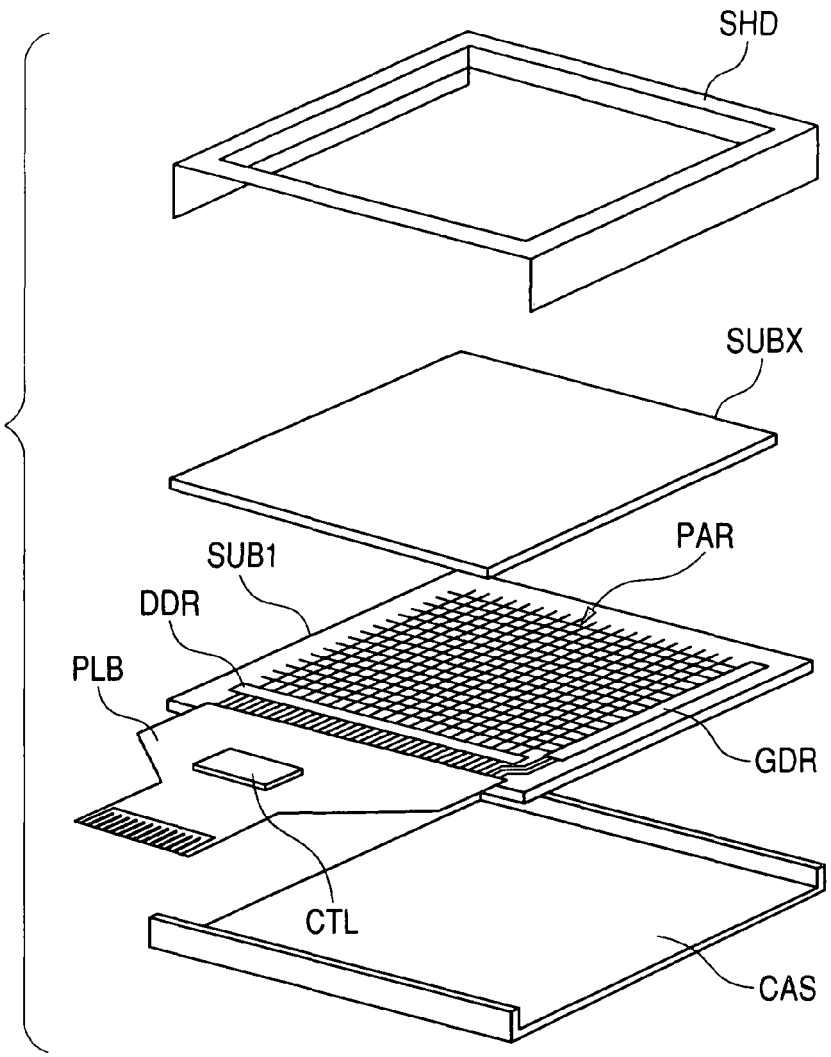
FIG. 17 is a developed perspective view of an organic EL display device representing another example of the image display device that uses an insulated substrate provided with thin film transistors made of a semiconductor film according to the method of the present invention.
Figure 18:
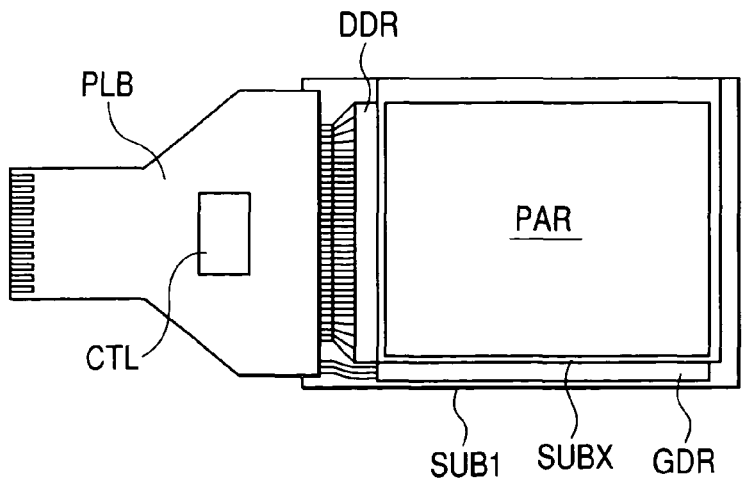
FIG. 18 is a top view of the organic EL display device in which the components shown in FIG. 17 are all united into one unit.
Figure 19A:
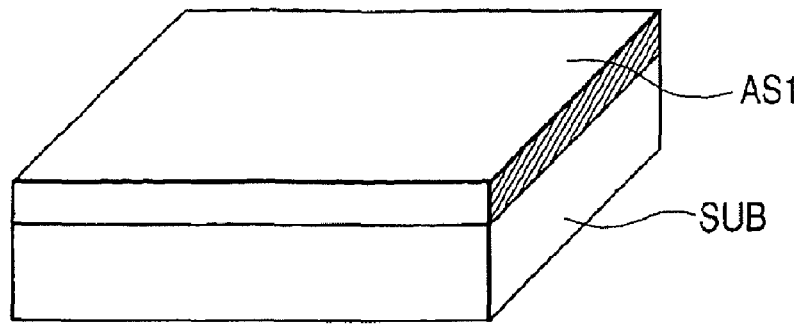
FIG. 19A is a diagram which illustrates an amorphous silicon film.
Figure 19B:
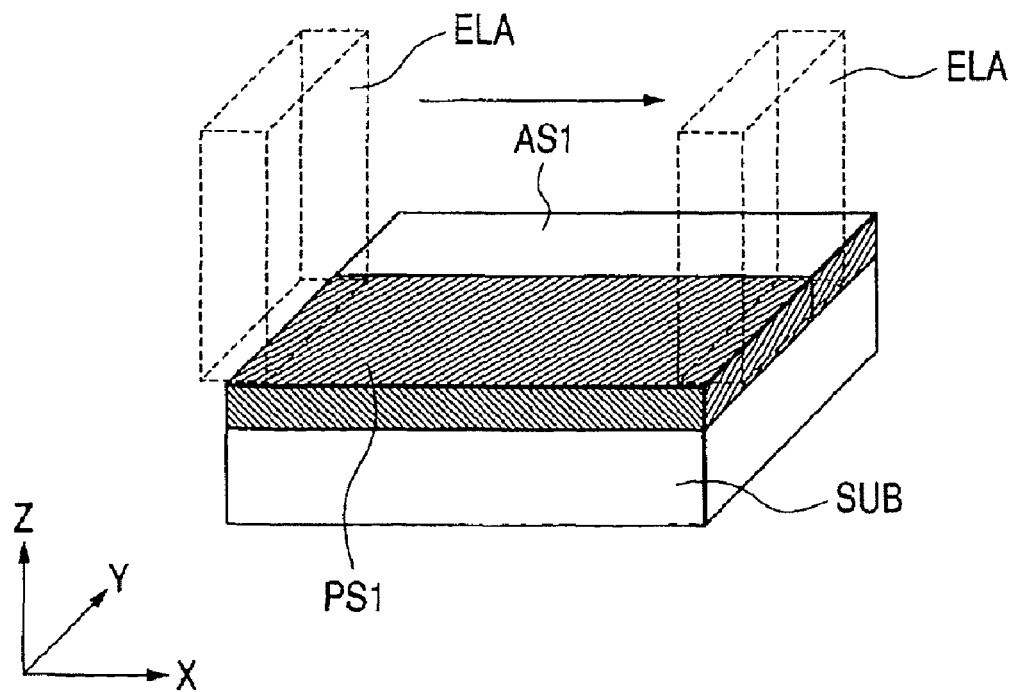
FIG. 19B is a diagram which illustrates how to crystallize an amorphous silicon film by scanning a general excimer pulse laser beam thereon.
Figure 20:
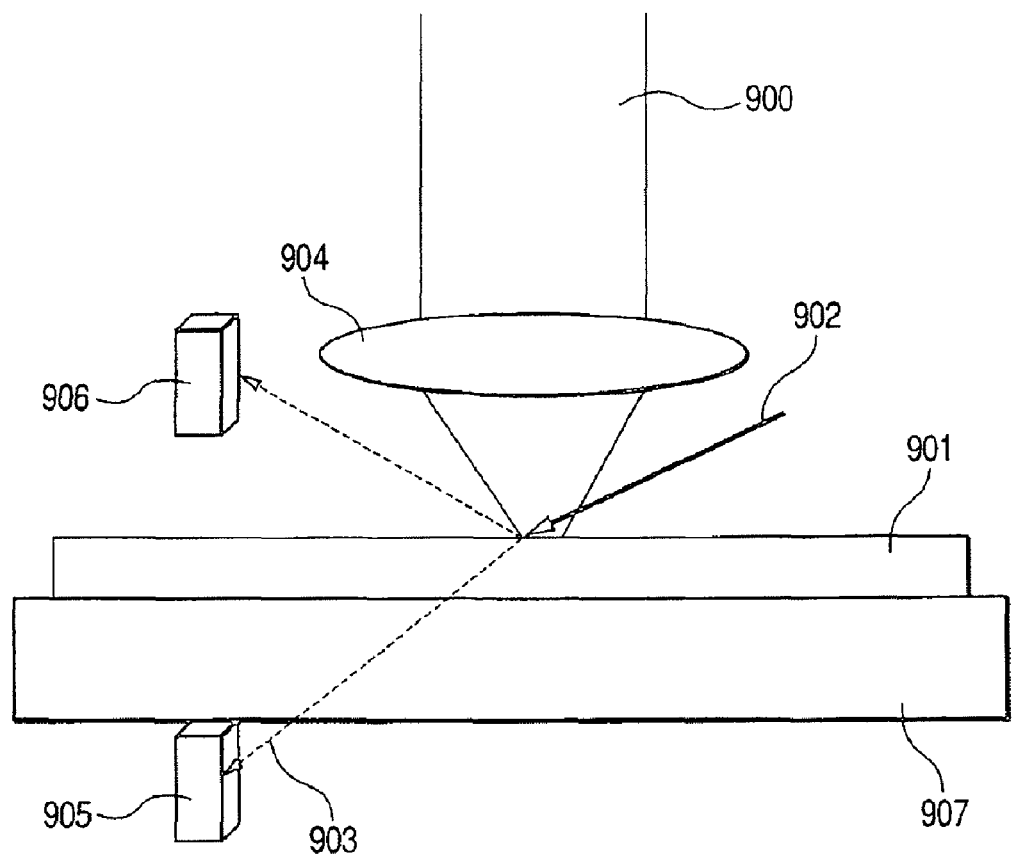
FIG. 20 is a diagram showing an example of a semiconductor film inspection device.

The active matrix substrate in this embodiment can also be used to manufacture organic EL display devices. FIG. 17 is a developed perspective view of such an organic EL display device representing a second example of an image display device that uses an insulated substrate having thin film transistors manufactured using the semiconductor film according to the present invention. FIG. 18 is a top view of the organic EL display device in which the components shown in FIG. 17 are united into one unit.

Hereunder, a description will be given to indicate how to form an organic EL element on an image electrode provided on the active matrix to substrate SUB1 in any of the above-described embodiments. The organic EL element is a laminated layer having a hole transfer layer, a light emission layer, an electron transfer layer, a cathode metallic layer, etc. that are deposited consecutively on the pixel electrode surface. Then, a sealing agent is provided around a pixel region PAR of the active matrix substrate SUB1, on which such a laminated layer is formed. Then, the sealing agent is sealed with a sealing substrate SUBX or sealing can. A protective film may also be used instead of the sealing substrate SUBX and the sealing can.

This organic EL display device supplies display signals received from the external signal source to the driving circuit region DDR through the printed board PLB. The printed board PLB has an interface circuit chip CTL. And, the shield frame SHD that serves as an upper case and a lower case CAS are united into one to configure the organic EL display device.

In case of active matrix driving for the organic EL display device, a high performance pixel circuit is indispensable to supply high quality images, since the organic EL element is driven by a current to emit its light. And, the image circuit should be composed of CMOS thin film transistors. A thin film transistor circuit to be formed in the driving circuit region is also indispensable to realize fast operations and fine images. The active matrix substrate SUB1 in this embodiment is sufficiently high in performance to satisfy such requirements. The organic EL display device that uses an active matrix substrate manufactured according to the method in this embodiment is one of the display devices that can realize the features of this embodiment up to its maximum.

While preferred forms of the present invention have been described, it is to be understood that modifications will be apparent to those skilled in the art without departing from the spirit of the invention. For example, the above-described manufacturing method of the present invention can apply to the manufacture of various kinds of semiconductor devices in addition to the active matrix substrate of the above-described image display device.

What is claimed is:

1. A method for manufacturing a semiconductor thin film, comprising:
    a step of forming an island-shaped region with an approximate band-shaped crystal semiconductor thin film crystallized and modified in film quality so that crystal grains grow laterally in a scanning direction by irradiating a continuous oscillation laser beam in a given region of said semiconductor thin film formed on an insulated substrate while scanning said continuous oscillation laser beam or said insulated substrate;
    a step of irradiating an inspection beam to an end region of said island-shaped region when said continuous oscillation laser beam is turned off;
    a step of evaluating the film quality of said semiconductor thin film by detecting an almost linearly-linked protrusion, which is generated when the continuous oscillation laser beam irradiation is switched from on to off in the process conditions on which lateral crystals are to be obtained, in the end region of said island-shaped region using the intensity or the distribution of its scattering light, reflection light, its diffraction light;
    a step of determining values for the laser energy and substrate scanning speed to form lateral crystals based on scattered light generated from an inspection beam irradiated on the end region of the island-shaped region; and
    a step of supplying a feedback of the determined laser energy and substrate scanning speed to two controllers.

2. The method according to claim 1:
    wherein, if there is any region that does not satisfy said predetermined film quality in said step of evaluating the film quality of said semiconductor thin film, said step of forming an approximate band-shaped crystal semiconductor thin film includes a step of crystallizing said approximate band-shaped crystal semiconductor thin film region by irradiating said laser beam thereto again.

3. The method according to claim 1:
    wherein the continuous oscillation laser beam is modulated with time at a predetermined width and/or at pulse intervals.

4. A method for manufacturing a semiconductor thin film, comprising:

a step of irradiating a continuous oscillation laser beam in an island-shaped region of the semiconductor thin film formed on an insulated substrate while scanning the continuous oscillation laser beam or the insulated substrate;

a step of irradiating an inspection beam to an end region, which is formed when the continuous oscillation laser beam is switched from ON to OFF, of the island-shaped region when said continuous oscillation laser beam is turned off, in order to evaluate a quality of modification by the continuous oscillation laser beam by detecting an almost linearly-linked protrusion formed in the end region;

a step of determining values for the laser energy and substrate scanning speed to form lateral crystals based on scattered light generated from an inspection beam irradiated on the end region of the island-shaped region; and a step of supplying a feedback of the determined laser energy and substrate scanning speed to two controllers.

5. The method manufacturing according to claim 4, wherein crystals, which have anisotropy such that crystal grains are bigger in the scanning direction that in the vertical direction to the scanning direction, are formed in the island-shaped region by irradiating the continuous oscillation laser beam.

6. The method manufacturing according to claim 4, wherein the intensity or the distribution of a scattering light of the inspection beam, a reflection light of the inspection beam, or a diffraction light of the inspection beam is detected in order to detect an almost linearly-linked protrusion formed in the end region.

7. The method according to claim 4:
wherein the continuous oscillation laser beam is modulated with time at a predetermined width and/or at pulse intervals.

8. The method according to claim 4, further comprising:
modifying a condition of irradiation of the continuous oscillation laser beam, in case that a protrusion higher than a predetermined level is not detected in the end region.

9. The method according to claim 4, further comprising:
recording a position of the island-shaped region, in case that dot-like protrusions are detected in the end region.

10. A method for manufacturing a semiconductor thin film, comprising:
a step of irradiating a continuous oscillation laser beam to the semiconductor thin film formed on an insulated substrate;
a step of forming an island-shaped region in the semiconductor thin film by scanning the continuous oscillation laser beam or the insulated substrate;
a step of detecting a shape of an end region, which is formed when the continuous oscillation laser beam is switched from ON to OFF, of the island-shaped region when said continuous oscillation laser beam is turned off;
a step of evaluating a condition of irradiation of the continuous oscillation laser beam by the detected shape of the end region;
a step of determining values for the laser energy and substrate scanning speed to form lateral crystals based on scattered light generated from an inspection beam irradiated on the end region of the island-shaped region; and
a step of supplying a feedback of the determined laser energy and substrate scanning speed to two controllers.

11. The method according to claim 10, further comprising:
a step of irradiating the continuous oscillation laser beam under a modified condition to the island-shaped region of the semiconductor thin film in case that a previous condition of irradiation of the continuous oscillation laser beam is not satisfactory.

12. The method according to claim 11:
wherein a condition of irradiation of the continuous oscillation laser beam is decided to be satisfactory, in case that an almost linearly-linked protrusion formed in the end region.

13. The method according to claim 11:
wherein a condition of irradiation of the continuous laser beam is not decided to be satisfactory, in case that a protrusion higher than a predetermined level is not formed in the end region or dot-like protrusions are formed in the end region.

14. The method manufacturing according to claim 10, wherein crystals, which have an anisotropy such that crystal grains are bigger in the scanning direction than in the vertical direction to the scanning direction, are formed in the island-shaped region by irradiating the continuous oscillation laser beam.

15. The method of manufacturing according to claim 10, wherein an inspection beam is irradiated to the end region and the intensity or the distribution of a scattering light of the inspection beam, a reflection light of the inspection beam, or a diffraction light of the inspection beam is detected in order to detect the shape of the end region.

16. The method according to claim 10:
wherein the continuous oscillation laser beam is modulated with time at a predetermined width and/or at pulse intervals.

* * * * *